United States Patent
Kubota

(10) Patent No.: US 9,915,848 B2
(45) Date of Patent: Mar. 13, 2018

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventor: Daisuke Kubota, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/249,531

(22) Filed: Apr. 10, 2014

(65) Prior Publication Data

US 2014/0313446 A1 Oct. 23, 2014

(30) Foreign Application Priority Data

Apr. 19, 2013 (JP) .................................. 2013-087969

(51) Int. Cl.
  *G02F 1/136* (2006.01)
  *G02F 1/1343* (2006.01)
  (Continued)

(52) U.S. Cl.
  CPC .......... *G02F 1/1368* (2013.01); *H01L 27/124* (2013.01); *H01L 27/1225* (2013.01);
  (Continued)

(58) Field of Classification Search
  USPC ................... 349/38, 39, 43, 110; 257/59, 72
  See application file for complete search history.

(56) References Cited

U.S. PATENT DOCUMENTS

| 5,731,856 A | 3/1998 | Kim et al. |
| 5,744,864 A | 4/1998 | Cillessen et al. |
| | (Continued) | |

FOREIGN PATENT DOCUMENTS

| EP | 1737044 A | 12/2006 |
| EP | 2226847 A | 9/2010 |
| | (Continued) | |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Edward Glick
*Assistant Examiner* — David Chung
(74) *Attorney, Agent, or Firm* — Robinson Intellectual Property Law Office; Eric J. Robinson

(57) ABSTRACT

A display device having fewer alignment defects is provided. A display device having a high aperture ratio and including a capacitor with increased charge capacity is provided. A display device having a high aperture ratio, including a capacitor with large charge capacity, and having fewer alignment defects is provided. The display device includes a pixel electrode, a transistor including a light-transmitting semiconductor layer connected to the pixel electrode, and a capacitor, a scan line, and a data line connected to the transistor. The transistor is arranged to overlap with the scan line. One of electrodes of the capacitor is formed on the same surface where the semiconductor layer is formed, and is formed in a region divided by the scan lines and the data lines. The other of the electrodes of the capacitor is a pixel electrode. The pixel electrode extends so as to intersect with the scan line.

27 Claims, 15 Drawing Sheets

(51) Int. Cl.
*G02F 1/1368* (2006.01)
*H01L 27/12* (2006.01)
*G02F 1/1362* (2006.01)

(52) U.S. Cl.
CPC .... *H01L 27/1255* (2013.01); *G02F 1/136213* (2013.01); *G02F 2201/40* (2013.01)

(56) References Cited

U.S. PATENT DOCUMENTS

| | | | |
|---|---|---|---|
| 5,781,254 A * | 7/1998 | Kim | G02F 1/136286 349/110 |
| 5,808,315 A * | 9/1998 | Murakami | H01L 21/285 257/59 |
| 5,847,410 A | 12/1998 | Nakajima | |
| 6,294,274 B1 | 9/2001 | Kawazoe et al. | |
| 6,563,174 B2 | 5/2003 | Kawasaki et al. | |
| 6,586,346 B1 | 7/2003 | Yamazaki et al. | |
| 6,727,522 B1 | 4/2004 | Kawasaki et al. | |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,301,211 B2 | 11/2007 | Yamazaki et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,459,723 B2 | 12/2008 | Okada et al. | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,626,669 B2 | 12/2009 | Lim et al. | |
| 7,674,650 B2 | 3/2010 | Akimoto et al. | |
| 7,732,819 B2 | 6/2010 | Akimoto et al. | |
| 7,989,815 B2 | 8/2011 | Yamazaki et al. | |
| 8,093,589 B2 | 1/2012 | Sugihara et al. | |
| 8,102,476 B2 | 1/2012 | Son et al. | |
| 8,324,027 B2 | 12/2012 | Yamazaki et al. | |
| 8,368,066 B2 | 2/2013 | Yamazaki et al. | |
| 8,389,988 B2 | 3/2013 | Yamazaki et al. | |
| 8,441,011 B2 | 5/2013 | Yamazaki et al. | |
| 8,476,625 B2 | 7/2013 | Kimura | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0094615 A1* | 5/2003 | Yamazaki | H01L 27/12 257/72 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0169991 A1* | 9/2004 | Nagata | G02F 1/136213 361/301.1 |
| 2005/0017302 A1 | 1/2005 | Hoffman | |
| 2005/0199959 A1 | 9/2005 | Chiang et al. | |
| 2005/0286003 A1* | 12/2005 | Lee | G02F 1/134363 349/141 |
| 2006/0033871 A1* | 2/2006 | Kim et al. | 349/139 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0068525 A1* | 3/2008 | Ishii | G02F 1/136209 349/44 |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0203387 A1 | 8/2008 | Kang et al. | |
| 2008/0224133 A1 | 9/2008 | Park et al. | |
| 2008/0251797 A1* | 10/2008 | Chang | 257/88 |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0101895 A1 | 4/2009 | Kawamura et al. | |
| 2009/0114910 A1 | 5/2009 | Chang | |
| 2009/0134399 A1 | 5/2009 | Sakakura et al. | |
| 2009/0141203 A1* | 6/2009 | Son | G02F 1/136213 349/39 |
| 2009/0146150 A1* | 6/2009 | Hosoya | G02F 1/1368 257/59 |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0283762 A1 | 11/2009 | Kimura | |
| 2010/0025678 A1 | 2/2010 | Yamazaki et al. | |
| 2010/0065839 A1 | 3/2010 | Yamazaki et al. | |
| 2010/0065840 A1 | 3/2010 | Yamazaki et al. | |
| 2010/0065844 A1 | 3/2010 | Tokunaga | |
| 2010/0072470 A1 | 3/2010 | Yamazaki et al. | |
| 2010/0072471 A1 | 3/2010 | Yamazaki et al. | |
| 2010/0092800 A1 | 4/2010 | Itagaki et al. | |
| 2010/0109002 A1 | 5/2010 | Itagaki et al. | |
| 2010/0163874 A1 | 7/2010 | Koyama et al. | |
| 2011/0032435 A1 | 2/2011 | Kimura | |

(56) References Cited

U.S. PATENT DOCUMENTS

| | | | |
|---|---|---|---|
| 2011/0085104 A1* | 4/2011 | Arasawa et al. | 349/43 |
| 2011/0140205 A1 | 6/2011 | Sakata et al. | |
| 2011/0242073 A1 | 10/2011 | Horiuchi et al. | |
| 2011/0303953 A1 | 12/2011 | Kamata | |
| 2011/0309362 A1* | 12/2011 | Yoon | G02F 1/136213 |
| | | | 257/59 |
| 2012/0062811 A1 | 3/2012 | Miyake | |
| 2012/0138932 A1 | 6/2012 | Lin et al. | |
| 2012/0241750 A1 | 9/2012 | Chikama et al. | |
| 2012/0298988 A1 | 11/2012 | Hara et al. | |
| 2012/0319107 A1 | 12/2012 | Miyake | |
| 2014/0175432 A1 | 6/2014 | Yamazaki et al. | |
| 2014/0362317 A1 | 12/2014 | Kubota et al. | |

FOREIGN PATENT DOCUMENTS

| | | |
|---|---|---|
| EP | 2 579 237 | 4/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-104312 | 4/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077822 | 3/2005 |
| JP | 2007-096055 | 4/2007 |
| JP | 2007-123861 | 5/2007 |
| JP | 2008-046599 A | 2/2008 |
| JP | 2008-186019 A | 8/2008 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solif State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of The 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology"; IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performane TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IgZo Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IgZo Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Techical Papers, May 31, 2009, pp. 983-985.

Lee.M et al., "15.4:Excellent Performance of Indium-Oxide-Based Thin-Film Transistors by DC Sputtering", SID Digest'09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest'09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest'09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Techncial Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED", AM-FPD '09 Digest of Techinal Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies In ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GiZo (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using-crystalline

(56) References Cited

OTHER PUBLICATIONS

InGaO3(ZnO)5 films", Appl. Phys. Lett. (Applied Physics Letters), Sep. 13, 2004, vol. 85, No. 11, pp. 1993-1995.

* cited by examiner

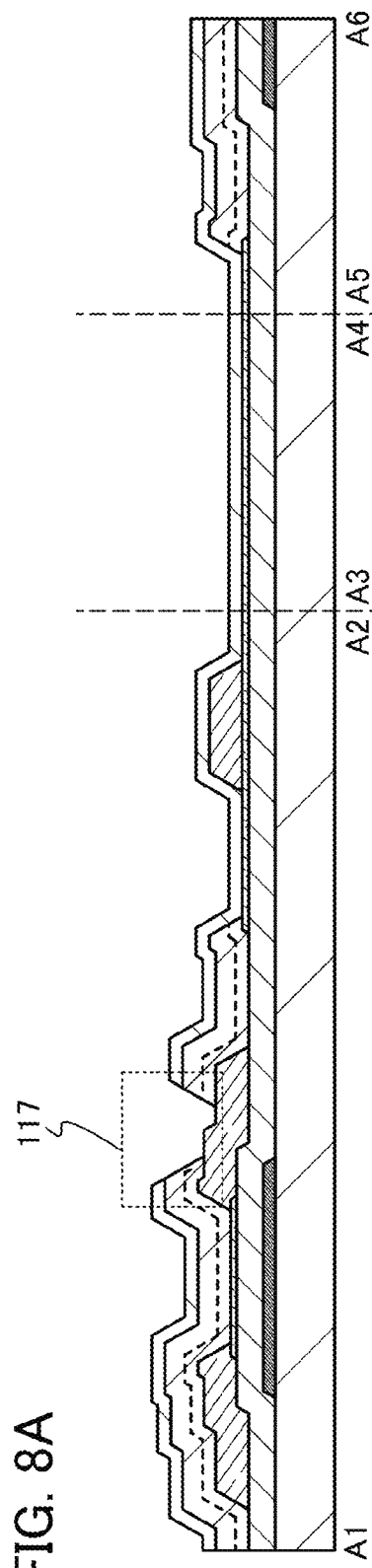
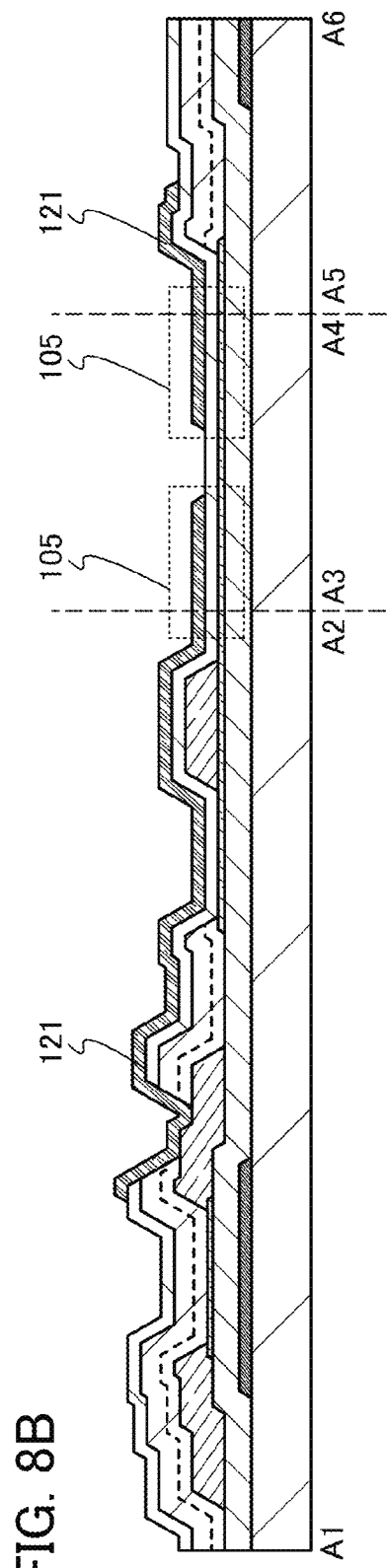
FIG. 8A
FIG. 8B

DISPLAY DEVICE AND ELECTRONIC DEVICE

BACKGROUND OF THE INVENTION

1. Field of the Invention

The invention disclosed in this specification and the like relates to a display device and an electronic device including the display device.

2. Description of the Related Art

In recent years, flat panel displays such as liquid crystal displays have been widespread. In each of pixels provided in the row direction and the column direction in a display device such as a flat panel display, a transistor serving as a switching element, a liquid crystal element electrically connected to the transistor, and a capacitor connected to the liquid crystal element in parallel are provided.

As a semiconductor material of a semiconductor film of the transistor, a silicon semiconductor such as amorphous silicon or polysilicon (polycrystalline silicon) is generally used.

Metal oxides having semiconductor characteristics (hereinafter referred to as oxide semiconductors) can be used for semiconductor films in transistors. For example, techniques for manufacturing transistors using zinc oxide or an In—Ga—Zn-based oxide semiconductor are disclosed (see Patent Documents 1 and 2).

REFERENCE

Patent Document

[Patent Document 1] Japanese Published Patent Application No. 2007-123861
[Patent Document 2] Japanese Published Patent Application No. 2007-096055

SUMMARY OF THE INVENTION

In a liquid crystal display, when unevenness such as a step difference around a pixel is large, alignment defects are likely to be caused. The alignment defects are likely to be caused along, for example, a scan line and a data line that are connected to a transistor and a side of a step difference near a pixel electrode. Thus, part of an opening of a pixel that can be used as a display region needs to be covered with a light-blocking film (what is called a black matrix, and also referred to as BM). Accordingly, an aperture ratio of the pixel is lowered, and the display quality of an image is lowered.

In order to reduce the alignment defects, unevenness such as a step difference due to a transistor or the like is subjected to planarization treatment using an organic resin or the like in many cases.

However, in the case where an oxide semiconductor is used as a semiconductor material included in the transistor, when impurities (typically, moisture or the like) contained in an organic resin enters the oxide semiconductor, which adversely affects the semiconductor characteristics. Thus, it has been necessary to manufacture a semiconductor device without using an organic resin as much as possible.

In a capacitor used for the liquid crystal display, a dielectric film is provided between a pair of electrodes at least one of which is formed, in many cases, using a conductive film serving as a gate electrode, a source electrode, a drain electrode, or the like of a transistor.

As the capacitance value of a capacitor is increased, a period in which the alignment of liquid crystal molecules of a liquid crystal element can be kept constant in the state where an electric field is applied can be made longer. When the period can be made longer in a display device that displays a still image, the number of times of rewriting image data can be reduced, leading to a reduction in power consumption.

One of methods for increasing the charge capacity of a capacitor is to increase the area occupied by the capacitor, specifically, to increase the area of a portion where a pair of electrodes overlap each other. However, in the display device, when the area of a conductive film is increased to increase the area of a portion where the electrodes overlap with each other, the aperture ratio of a pixel is lowered and thus display quality of an image is degraded.

Further, in the case where an area occupied by the capacitor is increased, an area of a depressed portion in a pixel is increased, and if planarization treatment using an organic resin or the like is not performed, the alignment defects of liquid crystal are caused by the influence of the depressed portion.

In view of the above problem, one object of one embodiment of the present invention is to provide a display device having fewer alignment defects. Further, another object of one embodiment of the present invention is to provide a display device having a high aperture ratio and including a capacitor which has increased charge capacity. Furthermore, another object of one embodiment of the present invention is to provide a display device having a high aperture ratio, including a capacitor with large charge capacity, and having fewer alignment defects.

One embodiment of the present invention is a display device including a pixel electrode; a transistor including a light-transmitting semiconductor layer connected to the pixel electrode; and a capacitor, a scan line, and a data line that are connected to the transistor. The transistor is arranged to overlap with the scan line. One of electrodes of the capacitor is formed on the same surface where the semiconductor layer is formed, and is formed in a region divided by the scan lines and the data lines. The other of the electrodes of the capacitor is a pixel electrode. The pixel electrode extends so as to intersect with the scan line.

Since the pixel electrode extends so as to intersect with the scan line, for example, an approximate half of a pixel can be positioned in a region divided by the scan lines and the data lines, and the other approximate half of the pixel can be positioned in an adjacent region divided by the scan lines and the data lines. With such an arrangement, an end portion of the pixel electrode is positioned away from the scan line; thus, a liquid crystal layer is not or is hardly affected by a step difference due to the scan line. Thus, the alignment defects of the liquid crystal layer due to the scan line can be reduced.

A method for manufacturing a display device that is one embodiment of the present invention is also one embodiment of the present invention.

According to one embodiment of the present invention, a display device having fewer alignment defects can be provided. Further, a display device having a high aperture ratio and including a capacitor which has increased charge capacity can be provided. Furthermore, a display device having a high aperture ratio, including a capacitor with large charge capacity, and having fewer alignment defects can be provided.

BRIEF DESCRIPTION OF THE DRAWINGS

FIGS. 8A and 8B are cross-sectional views illustrating a method for manufacturing a display device of one embodiment of the present invention.

DETAILED DESCRIPTION OF THE INVENTION

Figure 1:
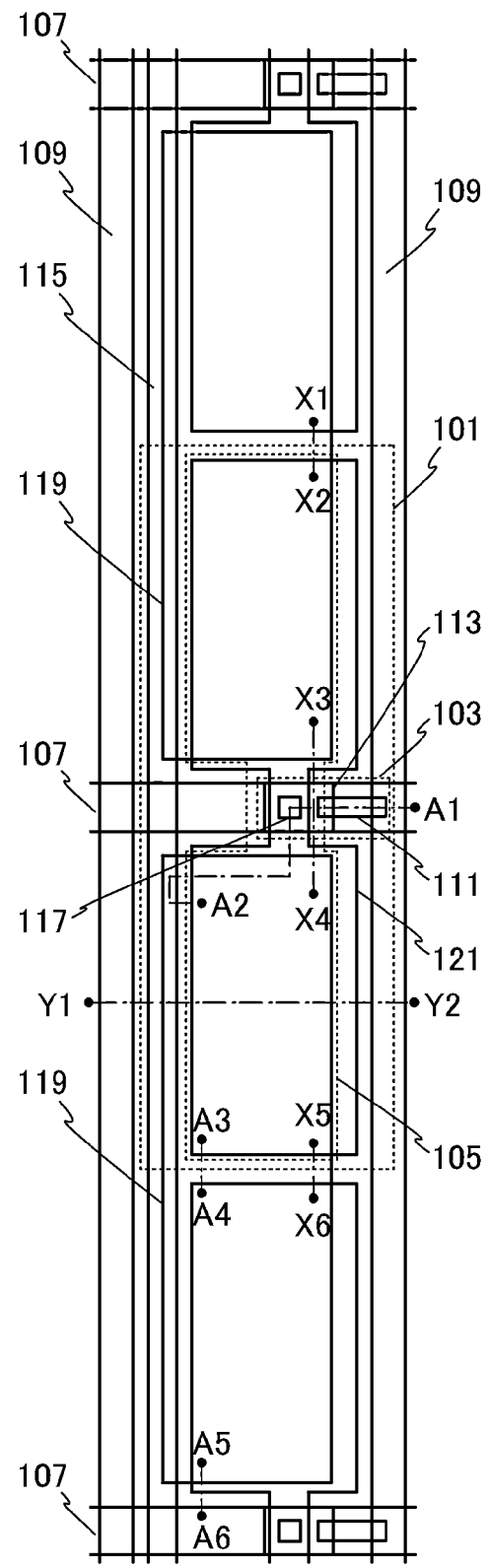
FIG. 1 is a top view illustrating a pixel and its periphery of a display device according to one embodiment of the present invention.

Hereinafter, embodiments of the present invention are described in detail with reference to the accompanying drawings. However, the present invention is not limited to the description below, and it is easily understood by those skilled in the art that modes and details disclosed herein can be modified in various ways. In addition, the present invention is not construed as being limited to the following descriptions of the embodiments and example.

Note that in structures of the present invention described below, the same portions or portions having similar functions are denoted by common reference numerals in different drawings, and descriptions thereof are not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, the embodiments of the present invention are not limited to such scales in the drawings.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those that specify one embodiment of the present invention.

Functions of a "source" and a "drain" in the present invention are sometimes replaced with each other when the direction of current flow is changed in circuit operation, for example. Therefore, the terms "source" and "drain" can be interchanged with each other in this specification.

Embodiment 1

In this embodiment, a display device of one embodiment of the present invention is described with reference to FIG. 1, FIG. 2, FIG. 3, FIG. 4, FIG. 5, FIGS. 6A to 6C, FIGS. 7A to 7C, and FIGS. 8A and 8B.

<Structural Example of Display Device>

FIG. 1 is a top view of a pixel and its periphery of a display device. Note that in the top view illustrated in FIG. 1, some components are omitted in order to avoid complexity of the drawing.

In FIG. 1, a scan line 107 extends in the direction substantially perpendicular to a data line 109 (in the horizontal direction in the drawing). The data line 109 is provided to extend in the direction substantially perpendicular to the scan line 107 (in the vertical direction in the drawing). A capacitor line 115 extends in the direction substantially parallel to the data line 109.

A transistor 103 is formed to overlap with the scan line 107 and formed near a region at which the scan line 107 intersects with the data line 109. The transistor 103 includes at least a semiconductor layer 111 including a channel formation region, a gate electrode, a gate insulating film (not illustrated in FIG. 1), a source electrode, and a drain electrode.

The scan line 107 also serves as a gate electrode of the transistor 103, and the data line 109 also serves as a source electrode of the transistor 103. A conductive layer 113 serves as a drain electrode of the transistor 103 and is electrically connected to a pixel electrode 121 through an opening 117. Further, in some cases, the term "the scan line 107" is used also to denote the gate electrode of the transistor 103 and the term "data line 109" is used also to denote the source electrode of the transistor 103 in the following description.

A capacitor 105 is formed of semiconductor layers 119 formed using a light-transmitting oxide semiconductor and having higher conductivity than that of the semiconductor layer 111 included in the transistor 103, the light-transmitting pixel electrode 121, and a light-transmitting insulating layer (not illustrated in FIG. 1) included in the transistor 103 as a dielectric layer. That is, the capacitor 105 can transmit light. Further, the capacitor line 115 is provided over and in contact with the semiconductor layers 119, and the capacitor line 115 is electrically connected to the semiconductor layers 119.

In FIG. 1, the scan line 107 is positioned at the center of a pixel 101, and an approximate half of a pixel and an approximate half of another pixel are formed in the region divided by the scan lines 107 and the data lines 109. Note that the semiconductor layers 119 that are one of electrodes of the capacitor 105 are formed on the same surface where the semiconductor layer 111 included in the transistor 103 is formed, and are formed in the region divided by the scan lines 107 and the data lines 109. The pixel electrode 121 that is the other of electrodes of the capacitor 105 extends so as to intersect with the scan line 107.

Figure 2:
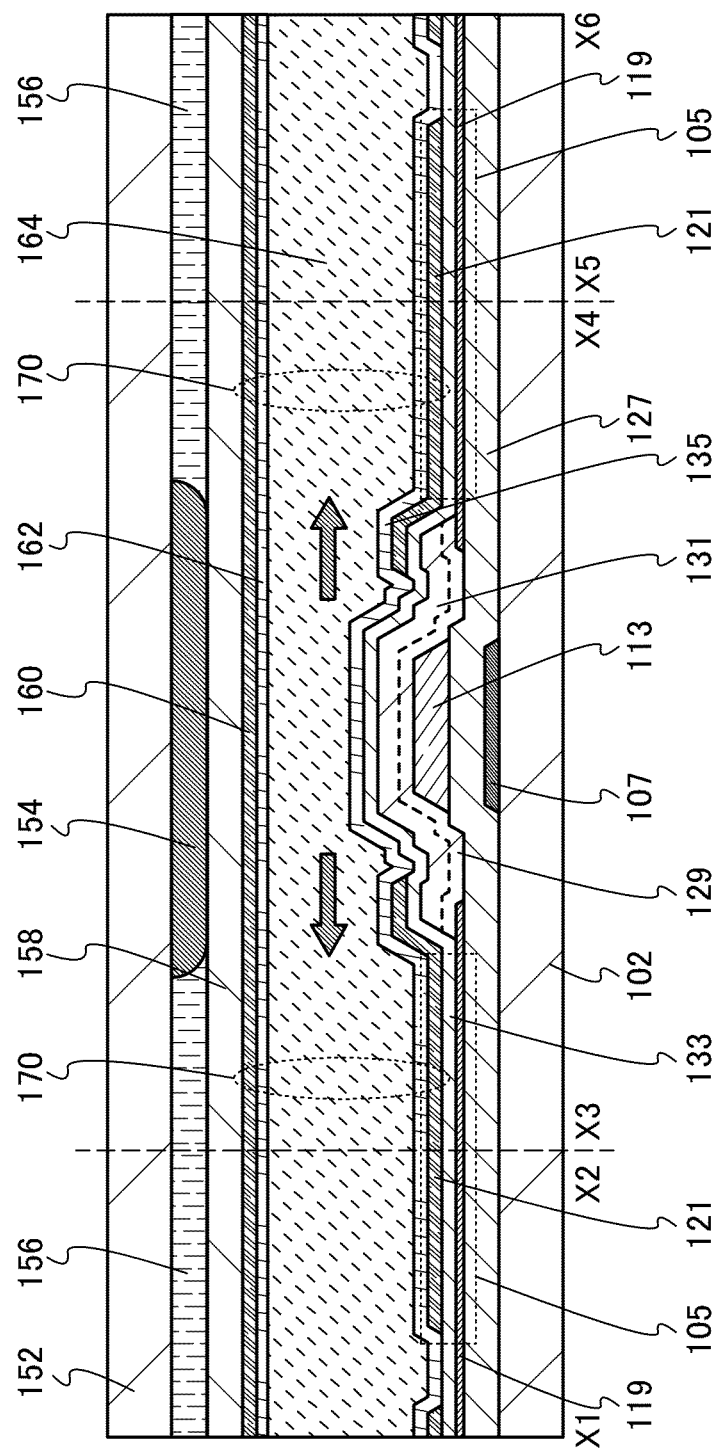
FIG. 2 is a cross-sectional view illustrating a pixel of a display device of one embodiment of the present invention.
Figure 4:
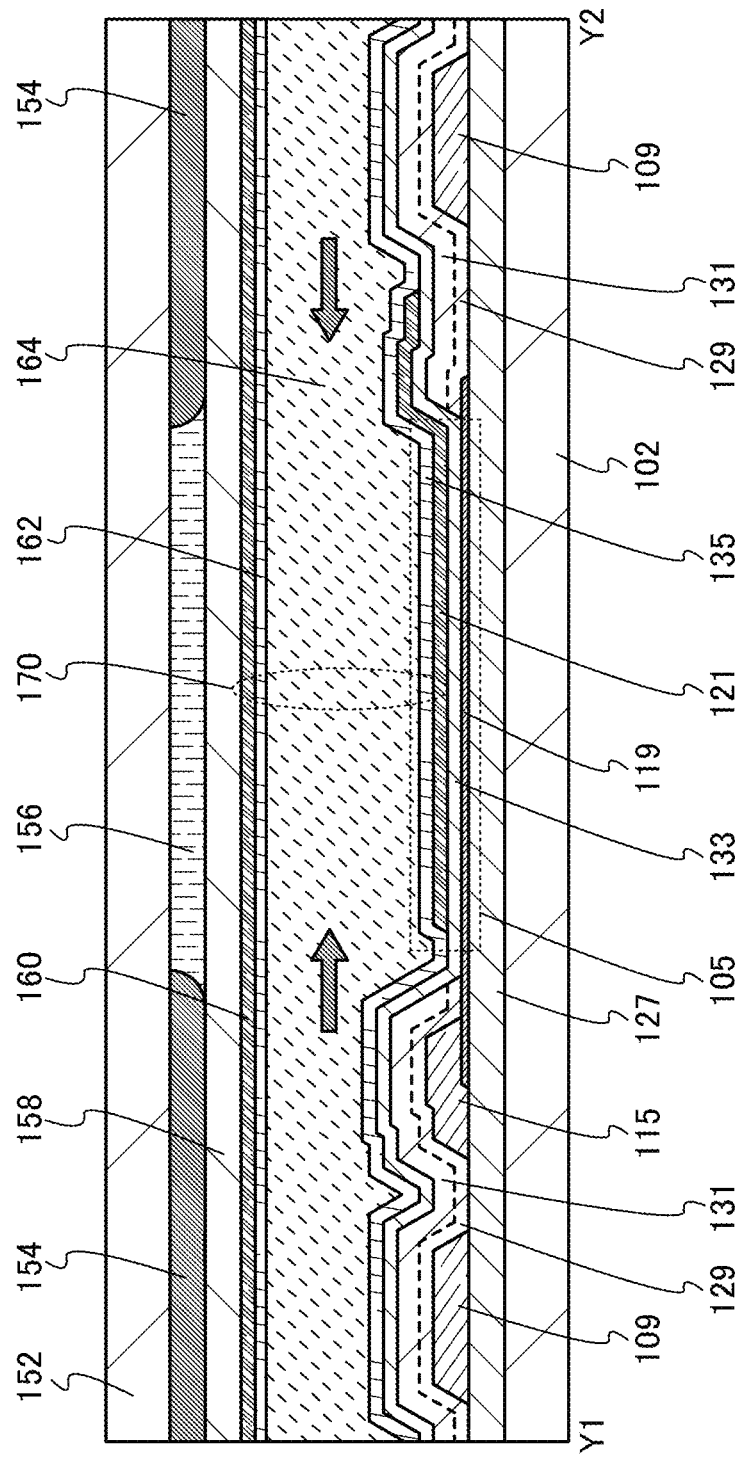
FIG. 4 is a cross-sectional view illustrating a pixel of a display device of one embodiment of the present invention.
Figure 5:
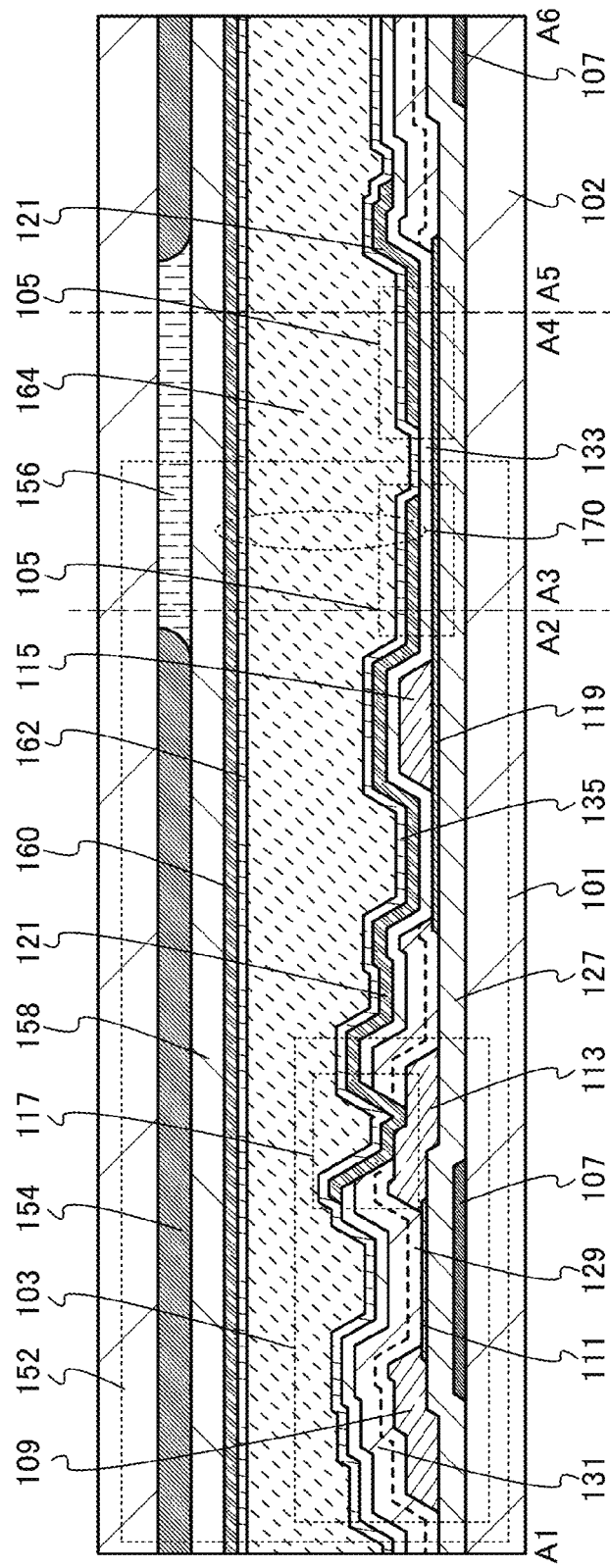
FIG. 5 is a cross-sectional view illustrating a pixel of a display device of one embodiment of the present invention.

Here, FIG. 2 illustrates a cross-sectional view taken along dashed-dotted lines X1-X2, X3-X4, and X5-X6 in FIG. 1 as a cross-sectional shape of the pixel 101 in the long-side direction. FIG. 4 illustrates a cross-sectional view taken along dashed-dotted line Y1-Y2 in FIG. 1 as a cross-sectional shape of the pixel 101 in the short-side direction. FIG. 5 illustrates a cross-sectional view taken along dashed-dotted lines A1-A2, A3-A4, and A5-A6 in FIG. 1 as cross-sectional shapes of the pixel 101, the transistor 103 included in the pixel 101, and their periphery.

The cross-sectional structure of a display device illustrated in FIG. 2 is described below.

The scan line 107 is provided over a substrate 102. An insulating layer 127 is provided over the scan line 107. A pair of semiconductor layers 119 is provided over the insulating layer 127. The conductive layer 113 is formed over the insulating layer 127 to overlap with the scan line 107. Insulating layers 129 and 131 are provided over the insulating layer 127, the semiconductor layer 119, and the conductive layer 113. Note that the insulating layers 129 and 131 cover an end portion of the semiconductor layer 119. The insulating layer 133 is provided to cover the semiconductor layer 119 and the insulating layer 131. The pixel electrode 121 is provided over an insulating layer 133 to overlap with the semiconductor layer 119. An alignment film 135 is provided over the insulating layer 133 and the pixel electrode 121.

The cross-sectional structure of a display device illustrated in FIG. 4 is described below.

The insulating layer 127 is provided over the substrate 102. The data line 109 and the semiconductor layer 119 are provided over the insulating layer 127. The capacitor line 115 is provided over the insulating layer 127 and the semiconductor layer 119. The insulating layers 129 and 131 are provided over the insulating layer 127, the data line 109, the capacitor line 115, and the semiconductor layer 119. Note that the insulating layers 129 and 131 cover an end portion of the semiconductor layer 119. The insulating layer 133 is provided to cover the semiconductor layer 119 and the insulating layer 131. The pixel electrode 121 is provided over the insulating layer 133 to overlap with the semiconductor layer 119. The alignment film 135 is provided over the insulating layer 133 and the pixel electrode 121.

The cross-sectional structure of a display device illustrated in FIG. 5 is described below.

The scan line 107 serving as a gate electrode of the transistor 103 is provided over the substrate 102. The insulating layer 127 serving as a gate insulating layer of the transistor 103 is provided over the scan line 107. The semiconductor layer 111 is provided in a region that is over the insulating layer 127 and overlaps with the scan line 107, and serves as a semiconductor layer of the transistor 103. The semiconductor layer 119 formed in the same step as the semiconductor layer 111 is provided over the insulating layer 127. The data line 109 serving as a source electrode of the transistor 103 and the conductive layer 113 serving as a drain electrode of the transistor 103 are provided over the semiconductor layer 111 and the insulating layer 127. The capacitor line 115 is provided over the semiconductor layer 119. The insulating layers 129 and 131 serving as a protective insulating layer of the transistor 103 are provided over the data line 109, the semiconductor layer 111, the semiconductor layer 119, and the insulating layer 127. Note that parts of end portions of the insulating layers 129 and 131 cover end portions of the semiconductor layer 119. The insulating layer 133 is formed to cover the insulating layer 131, the semiconductor layer 119, and the capacitor line 115. The opening 117 reaching the conductive layer 113 is provided in the insulating layers 129, 131, and 133, and the pixel electrode 121 is provided in the opening 117 and over the insulating layer 133. The alignment film 135 is provided over the insulating layer 133 and the pixel electrode 121.

In each of the display devices illustrated in FIG. 2, FIG. 4, and FIG. 5, a substrate 152 is placed to face the substrate 102. A liquid crystal layer 164 is provided between the substrate 102 and the substrate 152. Further, a light-blocking layer 154, a coloring layer 156, an insulating layer 158, a conductive layer 160, and an alignment film 162 are formed below the substrate 152. Note that a region in which the coloring layer 156 is formed serves as a display region.

A liquid crystal element 170 includes the pixel electrode 121, the alignment film 135, the liquid crystal layer 164, the alignment film 162, and the conductive layer 160. By application of voltage to the pixel electrode 121 and the conductive layer 160, the alignment state of the liquid crystal layer 164 can be controlled. Note that the alignment films 135 and 162 are not necessarily provided depending on a material used for the liquid crystal layer 164.

The capacitor 105 includes the semiconductor layers 119, the insulating layer 133, and the pixel electrode 121. The semiconductor layers 119 serve as the one of the electrodes of the capacitor 105. The semiconductor layer 119 can be shared by the capacitor 105 and an adjacent capacitor to use the semiconductor layer 119 as each of one of electrodes. Further, the pixel electrode 121 serves as the other of electrodes of the capacitor 105, and is apart from the other of the electrodes of the adjacent capacitor.

Arrows illustrated in FIG. 2 and FIG. 4 schematically show influence on the alignment of the liquid crystal layer 164 due to a step difference. Specifically, the liquid crystal layer 164 is affected by a step difference due to the capacitor line 115, a step difference due to the data line 109, and a step difference due to the scan line 107 and the conductive layer 113. Thus, the liquid crystal layer 164 is aligned while being affected by the step differences from three directions.

An example of a structure of a conventional pixel is described below with reference to FIG. 9, FIG. 10, FIG. 11, and FIG. 12.

<Structural Example of Display Device for Comparison>

Figure 9:
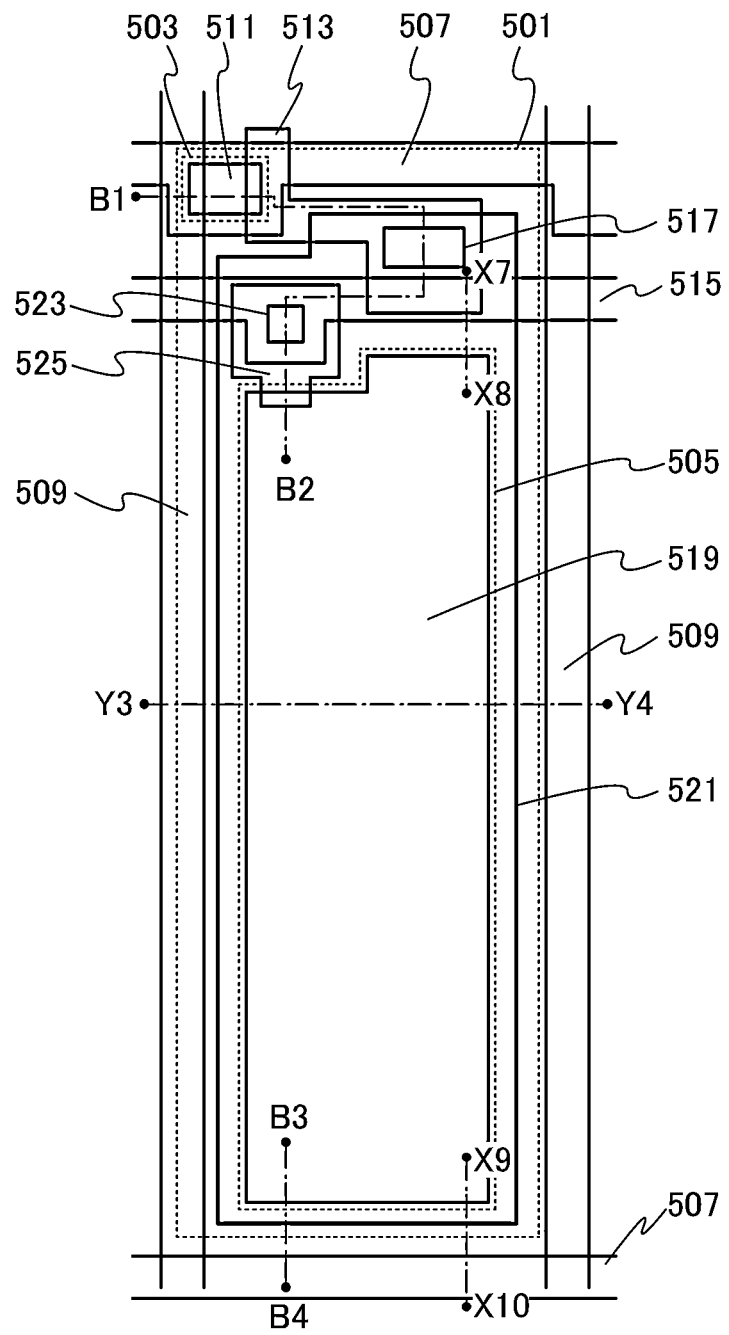
FIG. 9 is a top view illustrating a pixel and its periphery of a display device for comparison.

FIG. 9 is a top view of a pixel and its periphery of a display device.

In FIG. 9, a scan line 507 extends in a direction substantially perpendicular to a data line 509 (in the horizontal direction in the drawing). The data line 509 is provided to extend in the direction substantially perpendicular to the scan line 507 (in the vertical direction in the drawing). A capacitor line 515 extends in the direction substantially parallel to the scan line 507.

Further, a pixel 501 is formed in a region divided by the scan lines 507 and the data lines 509.

A transistor 503 is provided in a region of the pixel 501 in which the scan line 507 intersects with the data line 509. The transistor 503 includes at least a semiconductor layer 511 including a channel formation region, a gate electrode, a gate insulating film (not illustrated in FIG. 9), a source electrode, and a drain electrode.

The scan line 507 also serves as a gate electrode of the transistor 503, and the data line 509 also serves as a source electrode of the transistor 503. A conductive layer 513 serves as a drain electrode of the transistor 503 and is electrically connected to a pixel electrode 521 through an opening 517. Further, in some cases, the term "the scan line 507" is used also to denote the gate electrode of the transistor and the term "data line 509" is used also to denote the source electrode of the transistor in the following description.

A capacitor 505 is provided in a region of the pixel 501 that is divided by the capacitor line 515, the data lines 509, and the scan line 507. The capacitor 505 is electrically connected to the capacitor line 515 through a conductive layer 525 provided in and over an opening 523. The capacitor 505 is formed of a semiconductor layer 519 formed using a light-transmitting oxide semiconductor and having higher conductivity than that of the semiconductor layer 511, the light-transmitting pixel electrode 521, and a light-transmitting insulating layer (not illustrated in FIG. 9) included in the transistor 503 as a dielectric layer. That is, the capacitor 505 can transmit light.

Figure 10:
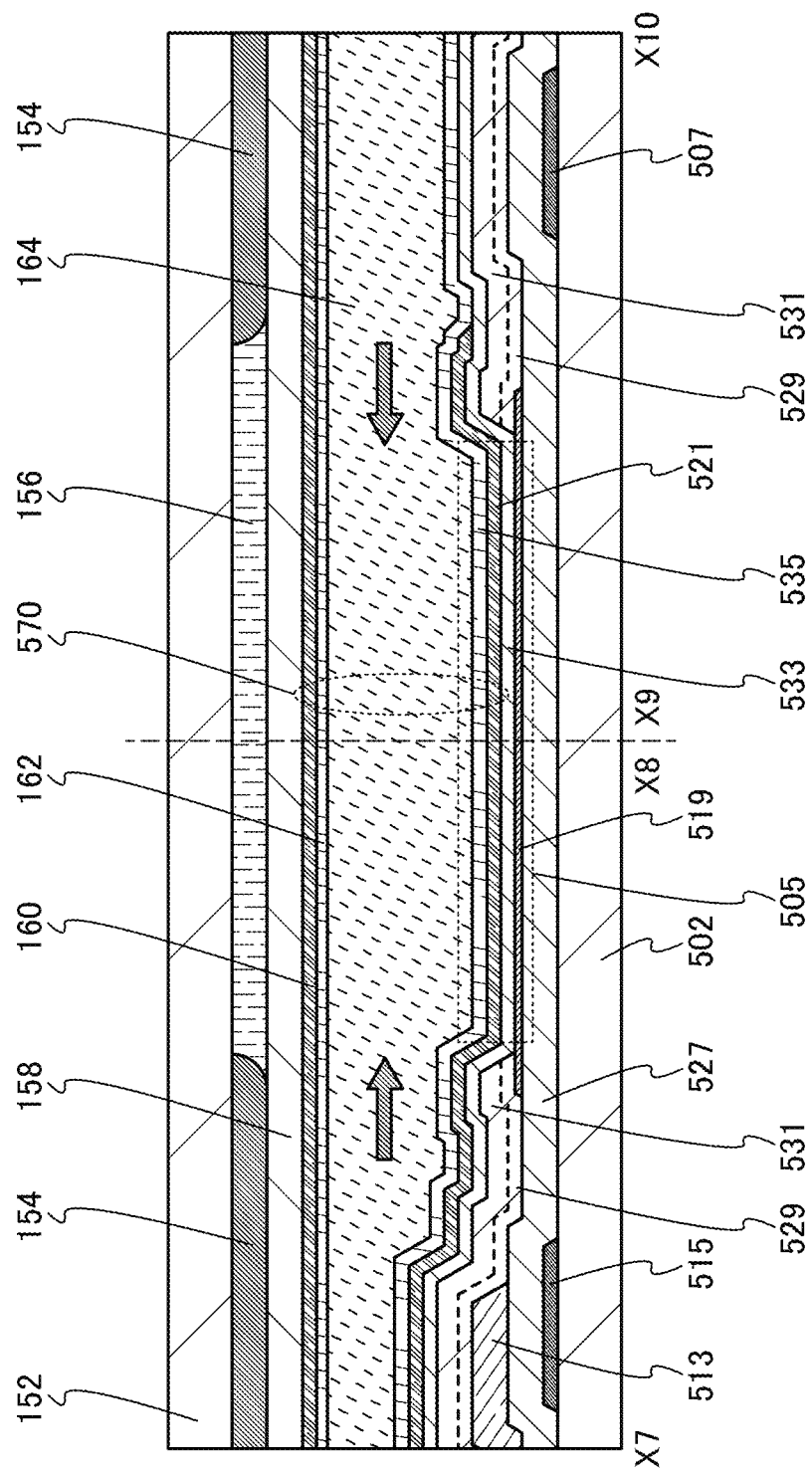
FIG. 10 is a cross-sectional view illustrating a pixel of a display device for comparison.
Figure 11:
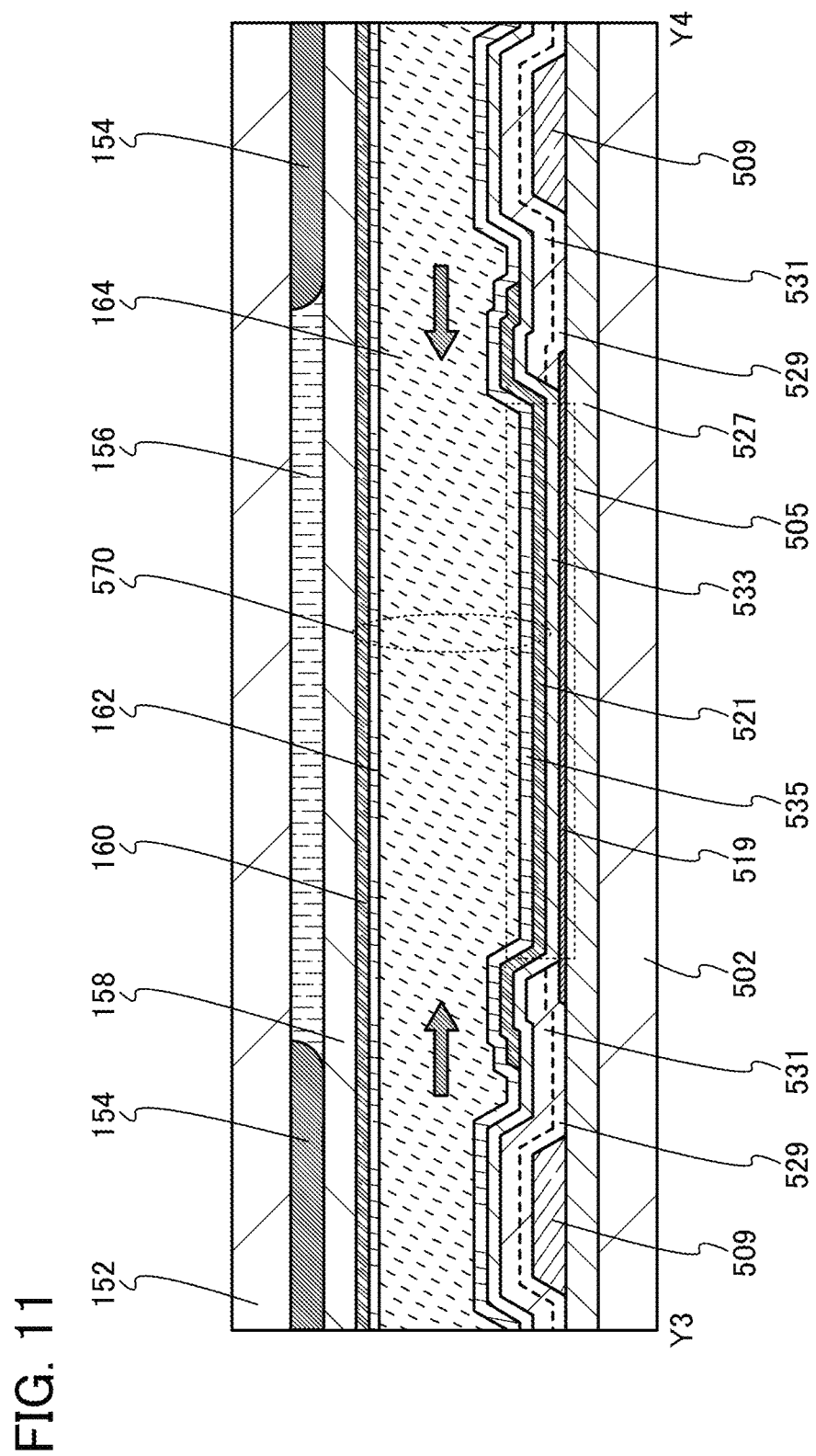
FIG. 11 is a cross-sectional view illustrating a pixel of a display device for comparison.
Figure 12:
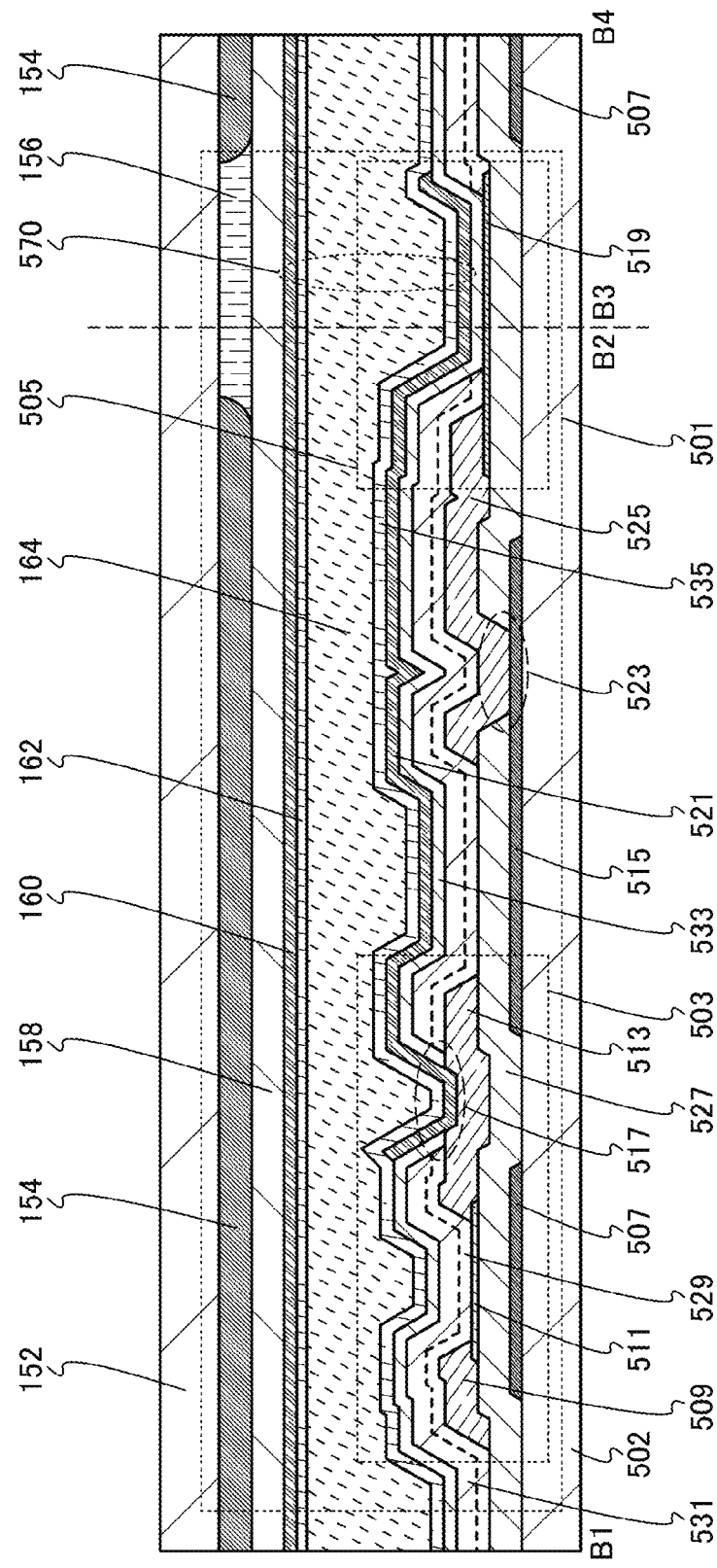
FIG. 12 is a cross-sectional view illustrating a pixel of a display device for comparison.

Here, FIG. 10 illustrates a cross-sectional view taken along dashed-dotted lines X7-X8 and X9-X10 in FIG. 9 as a cross-sectional shape of the pixel 501 in the long-side direction. FIG. 11 illustrates a cross-sectional view taken along dashed-dotted line Y3-Y4 in FIG. 9 as a cross-sectional shape of the pixel 501 in the short-side direction. FIG. 12 illustrates a cross-sectional view taken along dashed-dotted lines B1-B2 and B3-B4 in FIG. 9 as cross-sectional shapes of the transistor 503 included in the pixel 501, the periphery of the transistor 503, and an end portion of the pixel 501.

The cross-sectional structure of a display device illustrated in FIG. 10 is described below.

The scan line 507 and the capacitor line 515 are provided over a substrate 502. An insulating layer 527 is provided over the scan line 507 and the capacitor line 515. The conductive layer 513 is provided over the insulating layer 527 to overlap with the capacitor line 515. The semiconductor layer 519 is provided over the insulating layer 527. Insulating layers 529 and 531 are provided over the insulating layer 527, the conductive layer 513, and the semiconductor layer 519. Note that the insulating layers 529 and 531 cover end portions of the semiconductor layer 519. An insulating layer 533 is provided to cover the semiconductor layer 519 and the insulating layer 531. The pixel electrode 521 is provided over the insulating layer 533 to overlap with the semiconductor layer 519. An alignment film 535 is provided over the insulating layer 533 and the pixel electrode 521.

The cross-sectional structure of a display device illustrated in FIG. 11 is described below.

The insulating layer 527 is provided over the substrate 502. The data line 509 is provided over the insulating layer 527. The semiconductor layer 519 is provided between the data lines 509 over the insulating layer 527. The insulating layers 529 and 531 are provided over the insulating layer 527, the data line 509, and the semiconductor layer 519. Note that the insulating layers 529 and 531 cover end portions of the semiconductor layer 519. The insulating layer 533 is provided to cover the semiconductor layer 519 and the insulating layer 531. The pixel electrode 521 is provided over the insulating layer 533 to overlap with the semiconductor layer 519. The alignment film 535 is provided over the insulating layer 533 and the pixel electrode 521.

The cross-sectional structure of a display device illustrated in FIG. 12 is described below.

The scan line 507 serving as the gate electrode of the transistor 503 and the capacitor line 515 formed over the same surface where the scan line 507 is formed are provided over the substrate 502. The insulating layer 527 is provided over the scan line 507 and the capacitor line 515. The semiconductor layer 511 is provided over the insulating layer 527 to overlap with the scan line 507, and the semiconductor layer 519 is provided over the insulating layer 527. The data line 509 serving as the source electrode of the transistor 503 and the conductive layer 513 serving as a drain electrode of the transistor 503 are provided over the semiconductor layer 511 and the insulating layer 527. The opening 523 reaching the capacitor line 515 is provided in the insulating layer 527, and the conductive layer 525 is provided in and over the opening 523 and over the insulating layer 527 and the semiconductor layer 519. The insulating layers 529 and 531 serving as protective insulating layers of the transistor 503 are provided over the insulating layer 527, the data line 509, the semiconductor layer 511, the conductive layer 513, the conductive layer 525, and the semiconductor layer 519. Note that the insulating layers 529 and 531 are partly removed, so that an opening is provided over part of the semiconductor layer 519. The insulating layer 533 is provided over the insulating layer 531 and the semiconductor layer 519. The opening 517 reaching the conductive layer 513 is provided in the insulating layers 529, 531, and 533, and the pixel electrode 521 is provided in the opening 517 and over the insulating layer 533.

In each of the display devices illustrated in FIG. 10 to FIG. 12, the substrate 152 is placed to face the substrate 502. The liquid crystal layer 164 is provided between the substrate 502 and the substrate 152. Further, the light-blocking layer 154, the coloring layer 156, the insulating layer 158, the conductive layer 160, and the alignment film 162 are formed below the substrate 152. Note that a region in which the coloring layer 156 is formed serves as a display region.

A liquid crystal element 570 includes the pixel electrode 521, the alignment film 535, the liquid crystal layer 164, the alignment film 162, and the conductive layer 160. By application of voltage to the pixel electrode 521 and the conductive layer 160, the alignment state of the liquid crystal layer 164 can be controlled.

Further, the capacitor 505 includes the semiconductor layer 519, the insulating layer 533, and the pixel electrode 521. The semiconductor layer 519 serves as the one of the electrodes of the capacitor 505. Further, the pixel electrode 521 serves as the other of electrodes of the capacitor 505. Note that the semiconductor layer 519 and the pixel electrode 521 are apart from an adjacent pixel.

Arrows illustrated in FIG. 10 and FIG. 11 schematically show influence of alignment due to a step difference on the liquid crystal layer 164. Specifically, the liquid crystal layer 164 is affected by a step difference due to the capacitor line 515 and the conductive layer 513, a step difference due to the scan line 507, and a step difference due to a pair of data lines 509. Thus, the liquid crystal layer 164 is aligned while being affected by the step differences from four directions.

Thus, since the pixel 501 that is an example of a structure of a conventional display device is affected by the step differences from four directions, there is a high possibility that alignment defects of the liquid crystal layer 164 are caused. In particular, the alignment defects of the liquid crystal layer 164 are likely to be caused near the center of the pixel 501.

As compared to the conventional display device illustrated in FIG. 9 to FIG. 12, the display device of one embodiment of the present invention has the following superior effects.

In the pixel 101 of the display device of one embodiment of the present invention, an end portion of the pixel electrode 121 in the long-side direction is positioned near the center of the region divided by the scan lines 107 and the data lines 109. With such an arrangement, the end portion of the pixel electrode 121 is positioned away from the scan line 107; thus, the liquid crystal layer is not or is hardly affected by the step difference due to the scan line 107.

Since the end portion of the pixel electrode 121 is provided near the center of the region divided by the scan lines 107 and the data lines 109, the liquid crystal layer is not or is less affected by a step difference from one direction (in this embodiment, the step difference due to the scan line 107); thus, the alignment defects of the liquid crystal layer 164 due to the step difference can be reduced.

A planarization film, such as an organic resin, to reduce a step difference due to a transistor or the like is not used in the pixel 101 of the display device described in this embodiment. Thus, even in the case where an oxide semiconductor layer is used as a semiconductor layer of the transistor, for example, impurities (e.g., water contained in the organic resin) that can enter the oxide semiconductor layer are reduced; therefore, a highly reliable display device can be provided. Thus, with the display device of one embodiment of the present invention, alignment defects are reduced and a highly reliable transistor is used, leading to a display device having high display quality.

In the display device of one embodiment of the present invention illustrated in FIG. 1 to FIG. 5, the pixel electrode 121 extends so as to intersect with the scan line 107; thus, the liquid crystal layer 164 over an approximate half of the pixel electrode 121 has a different alignment direction from that of the liquid crystal layer 164 over the other approximate half of the pixel electrode 121. In other words, the display device of one embodiment of the present invention can have different alignment states in one pixel; thus, the display device can be what is called a multidomain vertical alignment (MVA) display device.

Figure 3:
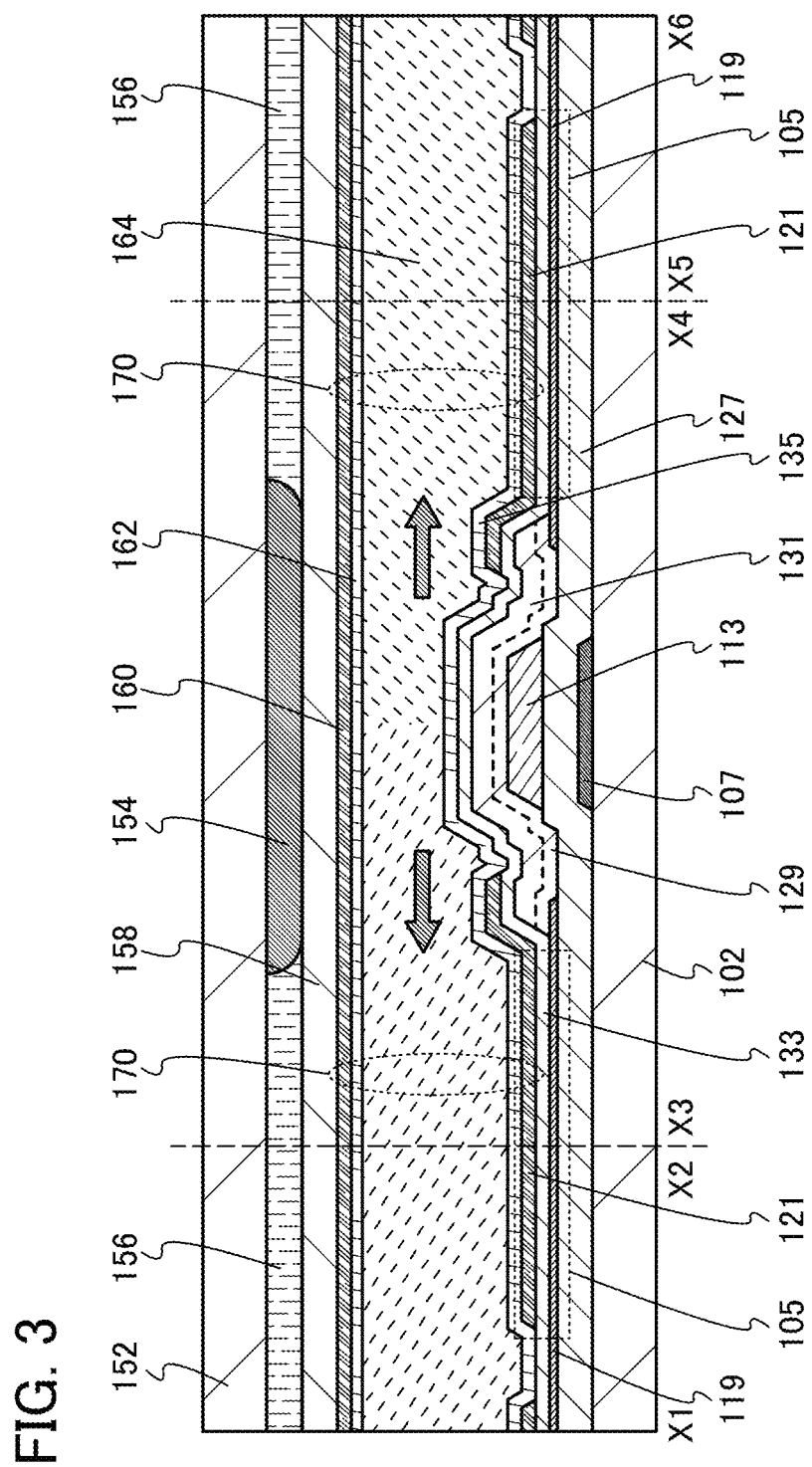
FIG. 3 is a cross-sectional view illustrating a pixel of a display device of one embodiment of the present invention.

For example, in the case where the display device illustrated in FIG. 2 is an MVA display device, a structure illustrated in FIG. 3 can be given. Note that a cross-sectional view in FIG. 3 is different from the cross-sectional view illustrated in FIG. 2 only in the hatching of the liquid crystal layer 164.

The hatching of the liquid crystal layer 164 in the cross-sectional view illustrated in FIG. 3 schematically illustrates the alignment state of liquid crystal molecules.

In FIG. 3, because of the step difference of the scan line 107, the liquid crystal layer 164 over the pixel electrode 121 on the left can be aligned in the leftward direction in which there are no step differences. Further, in FIG. 3, because of the step difference of the scan line 107, the liquid crystal layer 164 over the pixel electrode 121 on the right can be aligned in the rightward direction in which there are no step differences.

As described above, in the display device of one embodiment of the present invention illustrated in FIG. 3, by utilizing the step difference of the scan line 107, the alignment direction of the liquid crystal layer 164 over the pixel electrode 121 on the left above the scan line 107 can be different from that of the liquid crystal layer 164 over the pixel electrode 121 on the right above the scan line 107 without additionally providing a protrusion such as a rib for controlling the alignment state of liquid crystal. Accordingly, the viewing angle dependence is improved, and a more excellent display device can be provided.

Note that other components of the display device of one embodiment of the present invention illustrated in FIG. 1 to FIG. 5 are described in detail in the next description of a method for manufacturing a display device.

<Method for Manufacturing Display Device>

Next, a method for manufacturing the display device illustrated in FIG. 1 to FIG. 5 is described below with reference to FIGS. 6A to 6C, FIGS. 7A to 7C, and FIGS. 8A and 8B. Note that in FIG. 6A to FIG. 8B, a cross-sectional structure of the display device illustrate in FIG. 5 is described as an example.

First, the substrate 102 is prepared. For the substrate 102, a glass material such as aluminosilicate glass, aluminoborosilicate glass, or barium borosilicate glass is used. In the mass production, for the substrate 102, a mother glass with any of the following sizes is preferably used: the 8-th generation (2160 mm×2460 mm), the 9-th generation (2400 mm×2800 mm or 2450 mm×3050 mm), the 10-th generation (2950 mm×3400 mm), and the like. High process temperature and a long period of process time drastically shrink the mother glass. Thus, in the case where mass production is performed with the use of the mother glass, it is preferable that the heat process in the manufacturing process be preferably performed at a temperature lower than or equal to 600° C., further preferably lower than or equal to 450° C., still further preferably lower than or equal to 350° C.

Next, a conductive layer is formed over the substrate 102, and the conductive layer is processed into a desired region, so that the scan line 107 is formed. After that, the insulating layer 127 is formed over the substrate 102 and the scan line 107 (see FIG. 6A).

The scan line 107 can be formed using a metal element selected from aluminum, chromium, copper, tantalum, titanium, molybdenum, and tungsten, an alloy containing any of these metal elements as a component, an alloy containing these metal elements in combination, or the like. Further, the scan line 107 may have a single-layer structure or a stacked-layer structure of two or more layers. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film that contains aluminum and one or more elements selected from titanium, tantalum, tungsten, molybdenum, chromium, neodymium, and scandium may be used. Further, the scan line 107 can be formed by a sputtering method, for example.

The insulating layer 127 is formed with a single-layer structure or a stacked-layer structure using, for example, any of a silicon nitride oxide film, a silicon nitride film, an aluminum oxide film, and the like with a PE-CVD apparatus. In the case where the insulating layer 127 has a stacked-layer structure, it is preferable that a silicon nitride film with fewer defects be provided as a first silicon nitride film, and a silicon nitride film from which hydrogen and ammonia are less likely to be released be provided over the first silicon nitride film, as a second silicon nitride film. As a result, hydrogen and nitrogen contained in the insulating layer 127 can be prevented from moving or diffusing into the semiconductor layer 111 to be formed later.

The insulating layer 127 is formed to have a single-layer structure or a stacked-layer structure using any of a silicon oxide film, a silicon oxynitride film, and the like with a PE-CVD apparatus.

The insulating layer 127 can have a stacked-layer structure, for example, in which a 400-nm-thick silicon nitride film and a 50-nm-thick silicon oxynitride film are formed in this order. The silicon nitride film and the silicon oxynitride film are preferably formed in succession in a vacuum such that fewer impurities are mixed into the films. Note that a portion of the insulating layer 127 that overlaps with the scan line 107 serves as the gate insulating layer of the transistor 103. Note that silicon nitride oxide refers to an insulating material that contains more nitrogen than oxygen, whereas silicon oxynitride refers to an insulating material that contains more oxygen than nitrogen.

When the gate insulating layer has the above structure, the following effects can be obtained, for example. The silicon nitride film has a higher dielectric constant than a silicon oxide film and needs a larger thickness for an equivalent capacitance. Thus, the thickness of the gate insulating film can be increased. This makes it possible to reduce a decrease in withstand voltage of the transistor 103 and furthermore increase the withstand voltage, thereby reducing electrostatic breakdowns of the transistor 103.

Figure 6A:
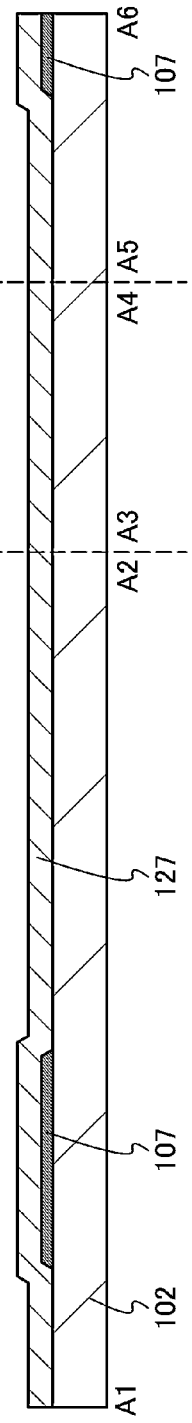
FIGS. 6A to 6C are cross-sectional views illustrating a method for manufacturing a display device of one embodiment of the present invention.
Figure 6B:
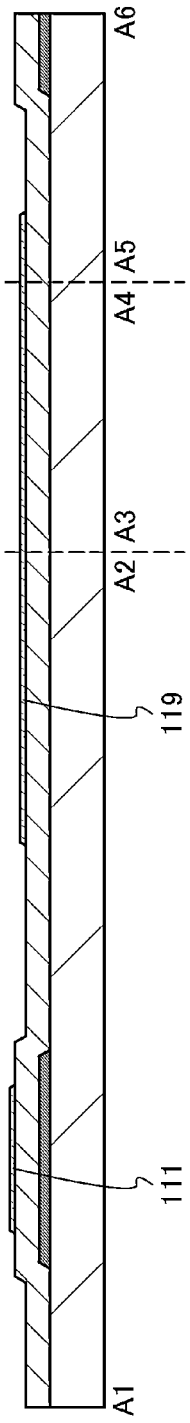
Figure 6C:
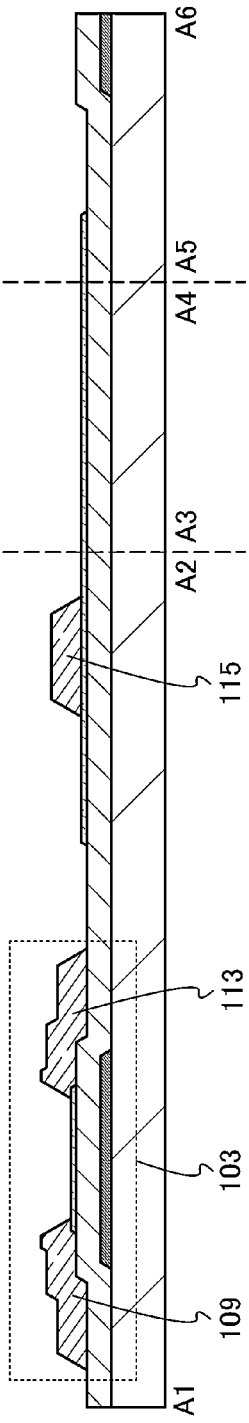

Next, a semiconductor layer is formed over the insulating layer 127, and the semiconductor layer is processed into a desired region, so that the semiconductor layers 111 and 119 are formed (see FIG. 6B).

The semiconductor layers 111 and 119 are preferably formed using an oxide semiconductor film. The oxide semiconductor film preferably includes a film represented by an In-M-Zn oxide that contains at least indium (In), zinc (Zn), and M (M is a metal such as Al, Ga, Ge, Y, Zr, Sn, La, Ce, or Hf). Alternatively, both In and Zn are preferably contained. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As an oxide semiconductor included in the semiconductor layers 111 and 119, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here an "In—Ga—Zn-based oxide" means an oxide containing In, Ga, and Zn as its main components and there is no limitation on the ratio of In, Ga, and Zn. The In—Ga—Z-based oxide may contain another metal element in addition to In, Ga, and Zn.

As a method for forming the semiconductor layers 111 and 119, a sputtering method, a molecular beam epitaxy (MBE) method, a chemical vapor deposition (CVD) method, a pulsed laser deposition method, an atomic layer deposition (ALD) method, or the like can be used as appropriate.

In the formation of an oxide semiconductor film as the semiconductor layers 111 and 119, the hydrogen concentration in the oxide semiconductor films is preferably reduced as much as possible. To reduce the hydrogen concentration, for example, in the case of a sputtering method, a formation chamber needs to be highly evacuated and also a sputtering gas needs to be highly purified. As an oxygen gas or an argon gas used for a sputtering gas, a gas that is highly purified to have a dew point of −40° C. or lower, preferably −80° C. or lower, further preferably −100° C. or lower, still further preferably −120° C. or lower is used, whereby entry of moisture or the like into the oxide semiconductor film can be prevented as much as possible.

In order to remove moisture remaining in the deposition chamber, an entrapment vacuum pump, such as a cryopump, an ion pump, or a titanium sublimation pump, is preferably used. The evacuation unit may be a turbo molecular pump provided with a cold trap. When the film formation chamber is evacuated with a cryopump, which has a high capability in removing a hydrogen molecule, a compound including a hydrogen atom such as water ($H_2O$) (preferably, also a compound including a carbon atom), and the like, the concentration of impurities to be contained in a film formed in the film formation chamber can be reduced.

Further, in the case where the oxide semiconductor film is formed as the semiconductor layers 111 and 119 by a sputtering method, the relative density (the fill rate) of a metal oxide target used for forming the oxide semiconductor film is greater than or equal to 90% and less than or equal to 100%, preferably greater than or equal to 95% and less than or equal to 100%. With the use of the metal oxide target having high relative density, a dense oxide film can be formed.

Note that keeping the substrate 102 at high temperature during the formation of the oxide semiconductor film as the semiconductor layers 111 and 119 is also effective in reducing the concentration of impurities that can be contained in the oxide semiconductor film. The heating temperature of the substrate 102 may be higher than or equal to 150° C. and lower than or equal to 450° C., and preferably the substrate temperature is higher than or equal to 200° C. and lower than or equal to 350° C.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor that is used for the semiconductor layers 111 and 119 can be improved, and in addition, impurities such as hydrogen and water can be removed from the insulating layer 127 and the semiconductor layers 111 and 119. The first heat treatment may be performed before the semiconductor layers 111 and 119 are processed into island shapes.

Next, a conductive film is formed over the insulating layer 127 and the semiconductor layers 111 and 119, and the conductive film is processed into a desired region, so that the data line 109, the conductive layer 113, and the capacitor line 115 are formed. At this stage, the transistor 103 is formed (see FIG. 6C).

The data line 109, the conductive layer 113, and the capacitor line 115 can be formed to have a single-layer structure or a stacked-layer structure using, as a conductive material, any of single metals such as aluminum, titanium, chromium, nickel, copper, yttrium, zirconium, molybdenum, silver, tantalum, and tungsten, or an alloy containing any of these single metals as its main component. For example, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. The conductive film can be formed by a sputtering method, for example.

Figure 7A:
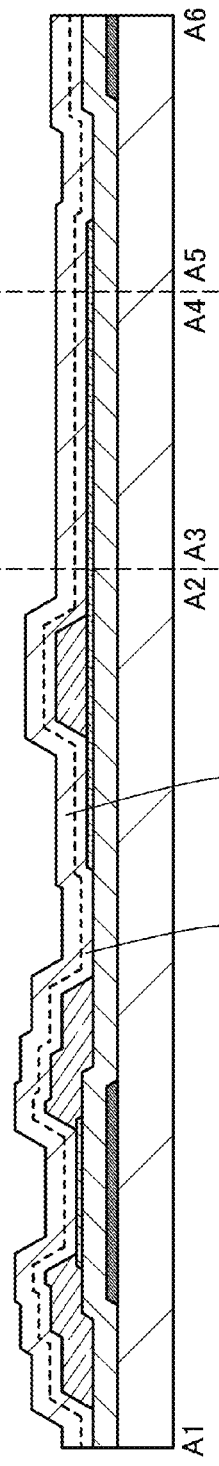
FIGS. 7A to 7C are cross-sectional views illustrating a method for manufacturing a display device of one embodiment of the present invention.

Next, the insulating layers 129 and 131 are formed over the insulating layer 127, the semiconductor layers 111 and 119, the data line 109, the conductive layer 113, and the capacitor line 115 (see FIG. 7A).

For the insulating layers 129 and 131, an inorganic insulating material containing oxygen can be used in order to improve the characteristics of the interface with the oxide semiconductor used for the semiconductor layers 111 and 119. The insulating layers 129 and 131 can be formed by a PE-CVD method, for example.

The thickness of the insulating layer 129 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating layer 131 can be greater than or equal to 30 nm and less than or equal to 500 nm, preferably greater than or equal to 150 nm and less than or equal to 400 nm.

Further, the insulating layers 129 and 131 can be formed using insulating films formed of the same kinds of materials; thus, a boundary between the insulating layer 129 and the insulating layer 131 cannot be clearly observed in some cases. Thus, in this embodiment, the boundary between the insulating layer 129 and the insulating layer 131 is shown by a dashed line. Although a two-layer structure of the insulating layers 129 and 131 is described in this embodiment, the present invention is not limited to this. For example, a single-layer structure of the insulating layer 129, a single-layer structure of the insulating layer 131, or a stacked-layer structure including three or more layers may be used.

Figure 7B:
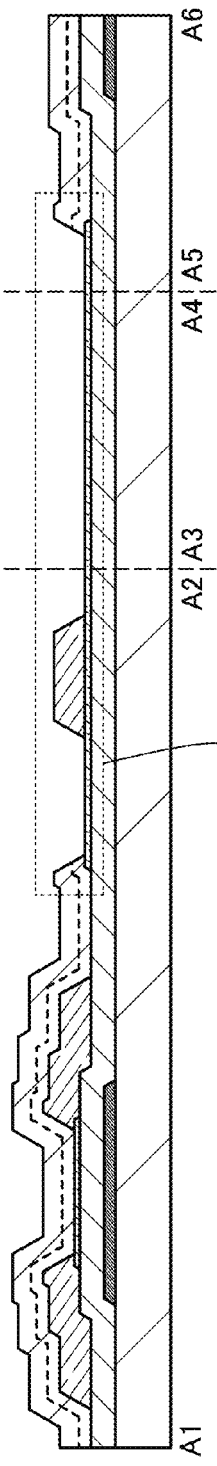

Next, the insulating layers 129 and 131 are processed into a desired region, so that an opening 140 is formed (see FIG. 7B).

Note that the opening 140 is formed to expose at least the semiconductor layer 119. In this embodiment, the semiconductor layer 119 and the capacitor line 115 are exposed in the opening 140. The opening 140 can be formed by a dry etching method, for example. Note that the method for forming the opening 140 is not limited to the dry etching method, and a wet etching method or a combination of dry etching and wet etching may be employed.

Figure 7C:
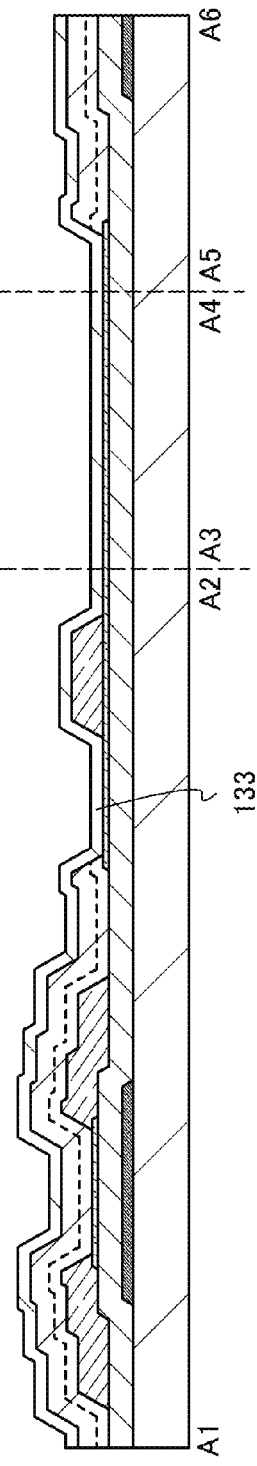

Next, the insulating layer 133 is formed over the insulating layer 131, the semiconductor layer 119, and the capacitor line 115 (see FIG. 7C).

The insulating layer 133 is a film formed using a material that can prevent an external impurity, such as moisture, alkali metal, or alkaline earth metal, from diffusing into the oxide semiconductor layer, and that further contains hydrogen. Thus, when hydrogen in the insulating layer 131 is diffused to the semiconductor layer 119, hydrogen is bonded to oxygen or to oxygen vacancies to generate electrons that are carriers in the semiconductor layer 119. As a result, the conductivity of the semiconductor layer 119 is increased, so that the semiconductor layer 119 becomes a conductive layer having a light-transmitting property.

In this embodiment, the method in which hydrogen is supplied from the insulating layer 133 in contact with the semiconductor layer 119 is described, but the present invention is not limited to this. For example, a mask is formed over the semiconductor layer 111 to serve as a channel of the transistor 103, and a region not covered with the mask can be supplied with hydrogen. For example, an ion doping apparatus or the like can be used to introduce hydrogen into the semiconductor layer 119. In addition, a light-transmitting conductive film (e.g., an ITO) can be formed in advance over the semiconductor layer 119.

For example, a silicon nitride film, a silicon nitride oxide film, or the like having a thickness of greater than or equal to 150 nm and less than or equal to 400 nm can be used as the insulating layer 133. In this embodiment, a 150-nm-thick silicon nitride film is used as the insulating layer 133.

The silicon nitride film is preferably formed at a high temperature to have an improved blocking property; for example, the silicon nitride film is preferably formed at a temperature in the range from the substrate temperature of 100° C. to the strain point of the substrate, more preferably at a temperature in the range from 300° C. to 400° C. When the silicon nitride film is formed at a high temperature, a phenomenon in which oxygen is released from the oxide semiconductor used for the semiconductor layer 111 and the carrier concentration is increased is caused in some cases; therefore, the upper limit of the temperature is a temperature at which the phenomenon is not caused.

Next, the insulating layers 129, 131 and 133 are processed into a desired region, so that the opening 117 is formed (see FIG. 8A).

Note that the opening 117 is formed to expose the conductive layer 113. The opening 117 can be formed by a dry etching method, for example. Note that the method for forming the opening 117 is not limited to this, and a wet etching method or a combination of dry etching and wet etching can be employed.

Next, a conductive layer is formed over the insulating layer 133 to cover the opening 117, and the conductive layer is processed into a desired region, so that the pixel electrode 121 is formed. At this stage, the capacitor 105 is formed (see FIG. 8B).

The pixel electrode 121 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added. Further, a conductive layer that can be used for the pixel electrode 121 can be formed by a sputtering method, for example.

The one of the electrodes of the capacitor 105 is the semiconductor layer 119 formed in the same step as the semiconductor layer 111 used for the transistor 103, and the semiconductor layer 119 is a light-transmitting semiconductor film. Further, a dielectric film of the capacitor 105 is a light-transmitting insulating film provided above the semiconductor layer 111 of the transistor 103. Further, the other of the electrodes of the capacitor 105 is the light-transmitting pixel electrode 121 electrically connected to the transistor 103. Thus, the capacitor 105 can be formed in the same steps as the transistor 103.

Thus, the capacitor 105 has a light-transmitting property and thus can be formed large (in a large area) in a region of the pixel where the transistor is not formed. Accordingly, one embodiment of the present invention can provide a semiconductor device whose aperture ratio and capacitance are increased. Further, an increase in aperture ratio can result in a semiconductor device with excellent display quality.

Through the above steps, the transistor 103 and the capacitor 105 can be formed over the substrate 102.

Next, a structure provided for the substrate 152 facing the substrate 102 is described below.

First, the substrate 152 is prepared. For the substrate 152, the materials that can be used for the substrate 102 can be referred to. Next, the light-blocking layer 154 and the coloring layer 156 are formed in contact with the substrate 152.

The light-shielding layer 154 preferably has a function of shielding light in a particular wavelength region, and can be a metal film or an organic insulating film including a black pigment or the like.

The coloring layer 156 is a coloring layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each color filter is formed in a desired position with any of various materials by a printing method, an inkjet method, an etching method using a photolithography technique, or the like.

Next, the insulating layer 158 is formed in contact with the light-blocking layer 154 and the coloring layer 156.

For the insulating layer 158, for example, an organic insulating film of an acrylic-based resin or the like can be used. With the insulating layer 158, impurities or the like contained in the coloring layer 156 can be prevented from diffusing into the liquid crystal layer 164, for example. Note that the insulating layer 158 is not necessarily formed.

Next, the conductive layer 160 is formed in contact with the insulating layer 158. For the conductive layer 160, a material that can be used for the pixel electrode 121 can be used.

Through the above steps, the structure provided for the substrate 152 can be formed.

Next, the alignment film 135 is formed in contact with the insulating layer 133 and the pixel electrode 121. Further, the alignment film 162 is formed in contact with the conductive layer 160. The alignment films 135 and 162 can be formed by a rubbing method, an optical alignment method, or the like. After that, the liquid crystal layer 164 is formed between the substrate 102 and the substrate 152. The liquid crystal layer 164 can be formed by a dispenser method (a dropping method), or an injecting method by which a liquid crystal is injected using a capillary phenomenon after the substrate 102 and the substrate 152 are bonded to each other.

Through the above steps, the display device illustrated in FIG. 1 and FIG. 5 can be manufactured.

This embodiment can be combined with any of the other embodiments in this specification as appropriate.

Embodiment 2

In this embodiment, an example of an oxide semiconductor layer that can be used for the transistor and the capacitor of the display device described in Embodiment 1 is described.

<Crystallinity of Oxide Semiconductor Layer>

A structure of an oxide semiconductor layer is described below.

An oxide semiconductor layer is classified roughly into a non-single-crystal oxide semiconductor layer and a single crystal oxide semiconductor layer. The non-single-crystal oxide semiconductor layer includes a c-axis aligned crystalline oxide semiconductor (CAAC-OS) film, a polycrystalline oxide semiconductor layer, a microcrystalline oxide semiconductor layer, an amorphous oxide semiconductor layer, and the like.

First, a CAAC-OS film is described.

The CAAC-OS film is one of oxide semiconductor layers including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM images and the plan TEM image, alignment is found in the crystal parts in the CAAC-OS film.

A CAAC-OS film is subjected to structural analysis with an x-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an x-ray enters a sample in a direction substantially perpendicular to the c-axis, a peak appears frequently when $2\theta$ is around $56°$. This peak is derived from the (110) plane of the $InGaZnO_4$ crystal. Here, analysis ($\varphi$ scan) is performed under conditions where the sample is rotated around a normal vector of a sample surface as an axis ($\varphi$ axis) with $2\theta$ fixed at around $56°$. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor layer having low impurity concentration. The impurity is an element other than main components of the oxide semiconductor layer, such as hydrogen, carbon, silicon, or a transition metal element. In particular, an element that has higher bonding strength to oxygen than a metal element included in the oxide semiconductor layer, such as silicon, disturbs the atomic arrangement of the oxide semiconductor layer by depriving the oxide semiconductor layer of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor layer and causes a decrease in crystallinity when it is contained in the oxide semiconductor layer. Note that the impurity contained in the oxide semiconductor layer might serve as a carrier trap or a carrier generation source.

The CAAC-OS film is an oxide semiconductor layer having a low density of defect states.

With the use of the CAAC-OS film in a transistor, variation in the electrical characteristics of the transistor due to irradiation with visible light or ultraviolet light is small.

Next, a microcrystalline oxide semiconductor layer is described.

In an image obtained with the TEM, crystal parts cannot be found clearly in the microcrystalline oxide semiconductor layer in some cases. In most cases, a crystal part in the microcrystalline oxide semiconductor layer is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor layer depending on an analysis method. For example, when the nc-OS film is subjected to structural analysis by an out-of-plane method with an XRD apparatus using an x-ray having a diameter larger than that of a crystal part, a peak that shows a crystal plane does not appear. Further, a diffraction pattern like a halo pattern appears in a selected-area electron diffraction pattern of the nc-OS film that is obtained by using an electron beam having a probe diameter (e.g., larger than or equal to 50 nm) larger than diameter of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to that of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor layer that has high regularity as compared to an amorphous oxide semiconductor layer. Therefore, the nc-OS film has a lower density of defect states than an amorphous oxide semiconductor layer. Note that there is no regularity of crystal orientation between different crystal parts in the nc-OS film. Therefore, the nc-OS film has a higher density of defect states than CAAC-OS film.

Note that an oxide semiconductor layer may be a stacked-layer film including two or more kinds of an amorphous oxide semiconductor layer, a microcrystalline oxide semiconductor layer, and a CAAC-OS film, for example.

<Formation Method of the CAAC-OS Film>

For example, the CAAC-OS film is formed by a sputtering method using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle or the pellet-like sputtered particle reaches a substrate while maintaining their crystal state, whereby the CAAC-OS film can be formed.

The flat-plate-like sputtered particle or the pellet-like sputtered particle has, for example, an equivalent circle diameter of a plane parallel to the a-b plane of greater than or equal to 3 nm and less than or equal to 10 nm, and a thickness (length in the direction perpendicular to the a-b plane) of greater than or equal to 0.7 nm and less than 1 nm. Note that in the flat-plate-like sputtered particle or the pellet-like sputtered particle, the plane parallel to the a-b plane may be a regular triangle or a regular hexagon. Here, the term "equivalent circle diameter of a plane" refers to the diameter of a perfect circle having the same area as the plane.

For the deposition of the CAAC-OS film, the following conditions are preferably used.

By increasing the substrate temperature during the deposition, migration of sputtered particles is likely to occur after the sputtered particles reach a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when the flat-plate-like sputtered particles or the pellet-like sputtered particles reach the substrate, migration occurs on the substrate surface, so that a flat plane of the sputtered particles is attached to the substrate. At this time, the sputtered particle is charged positively, whereby sputtered particles are attached to the substrate while repelling each other; thus, the sputtered particles do not overlap each other randomly, and a CAAC-OS film with a uniform thickness can be deposited.

By reducing the amount of impurities entering the CAAC-OS film during the deposition, the crystal state can be prevented from being broken by the impurities. For example, the concentration of impurities (e.g., hydrogen, water, carbon dioxide, or nitrogen) that exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

Alternatively, the CAAC-OS film is formed by the following method.

First, a first oxide semiconductor layer is formed to a thickness of greater than or equal to 1 nm and less than 10 nm. The first oxide semiconductor layer is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Then, heat treatment is performed to increase the crystallinity of the first oxide semiconductor layer to give the first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor layer for a short time. At the same time, the heat treatment in an inert atmosphere may generate oxygen vacancies in the first oxide semiconductor layer. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor layer for a short time.

The first oxide semiconductor layer with a thickness of greater than or equal to 1 nm and less than 10 nm can be easily crystallized by heat treatment as compared to the case where the first oxide semiconductor layer has a thickness of greater than or equal to 10 nm.

Next, a second oxide semiconductor layer having the same composition as the first oxide semiconductor layer is formed to a thickness of greater than or equal to 10 nm and less than or equal to 50 nm. The second oxide semiconductor layer is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Then, heat treatment is performed so that the second oxide semiconductor layer is turned into a second CAAC-OS film with high crystallinity by solid phase growth from the first CAAC-OS film. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor layer for a short time. At the same time, the heat treatment in an inert atmosphere may generate oxygen vacancies in the second oxide semiconductor layer. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor layer for a shorter time.

As described above, a CAAC-OS film with a total thickness of greater than or equal to 10 nm can be formed. The CAAC-OS film can be favorably used as the oxide semiconductor layer in the oxide stack.

Next, a method for forming an oxide film in the case where a formation surface has a low temperature (e.g., a temperature lower than 130° C., lower than 100° C., or lower than 70° C., or about a room temperature (20° C. to 25° C.)) because, for example, the substrate is not heated is described.

In the case where the formation surface has a low temperature, sputtered particles fall irregularly to the formation surface. For example, migration does not occur; therefore, the sputtered particles are randomly deposited on the deposition surface including a region where other sputtered particles have been deposited. That is, an oxide film obtained by the deposition might have a non-uniform thickness and a disordered crystal alignment. The oxide film obtained in the above manner maintains the crystallinity of the sputtered particles to a certain degree and thus has a crystal part (nanocrystal).

For example, in the case where the pressure at the deposition is high, the frequency with which the flying sputtered particle collides with another particle (e.g., an atom, a molecule, an ion, or a radical) of argon or the like is increased. When the flying sputtered particle collides with another particle (resputtered), the crystal structure of the sputtered particle might be broken. For example, when the sputtered particle collides with another particle, the plate-like or pellet-like shape of the sputtered particle cannot be kept, and the sputtered particle might be broken into parts (e.g., atomized). At this time, when atoms obtained from the sputtered particle are deposited on the formation surface, an amorphous oxide semiconductor film might be formed.

In the case where not a sputtering method using a target including polycrystalline oxide but a deposition method using liquid or a method for depositing a film by vaporizing a solid such as a target is used, the atoms separately fly to be deposited over the formation surface; therefore, an amorphous oxide film might be formed. Further, for example, by a laser ablation method, atoms, molecules, ions, radials, clusters, or the like released from the target flies to be deposited over the formation surface; therefore, an amorphous oxide film might be formed.

An oxide semiconductor layer included in a resistor and a transistor in one embodiment of the present invention may have any of the above crystal states. Further, in the case of stacked oxide semiconductor layers, the crystal states of the oxide semiconductor layers may be different from each other. Note that a CAAC-OS film is preferably applied to the oxide semiconductor layer functioning as a channel of the transistor. Further, the oxide semiconductor layer included in the resistor has a higher impurity concentration than that of the oxide semiconductor layer included in the transistor; thus, the crystallinity is lowered in some cases.

The structures, the methods, and the like described in this embodiment can be combined as appropriate with any of the structures, the methods, and the like described in the other embodiments.

Embodiment 3

In this embodiment, a display device of one embodiment of the present invention is described with reference to FIGS. 13A and 13B. Note that, in this embodiment, portions that are similar to the portions in Embodiment 1 are denoted by the same reference numerals, and detailed description thereof is omitted.

The display device illustrated in FIG. 13A includes a region including pixels of display elements (hereinafter the region is referred to as a pixel portion 302), a circuit portion being provided outside the pixel portion 302 and including a circuit for driving the pixels (hereinafter the portion is referred to as a driver circuit portion 304), circuits each having a function of protecting an element (hereinafter the circuits are referred to as protection circuits 306), and a terminal portion 307. Note that the protection circuits 306 are not necessarily provided.

A part or the whole of the driver circuit portion 304 is preferably formed over a substrate over which the pixel portion 302 is formed, in which case the number of components and the number of terminals can be reduced. When a part or the whole of the driver circuit portion 304 is not formed over the substrate over which the pixel portion 302 is formed, the part or the whole of the driver circuit portion 304 can be mounted by COG or TAB.

The pixel portion 302 includes circuits for driving a plurality of display elements in X rows (X is a natural number of 2 or more) and Y columns (Y is a natural number of 2 or more) (hereinafter, such circuits are referred to as pixels 101). The driver circuit portion 304 includes driver circuits such as a circuit for supplying a signal (scan signal) to select a pixel (hereinafter the circuit is referred to as a gate driver 304a) and a circuit for supplying a signal (data signal) to drive a display element in a pixel (hereinafter, the circuit is referred to as a source driver 304b).

The gate driver 304a includes a shift register or the like. The gate driver 304a receives a signal for driving the shift register through the terminal portion 307 and outputs a signal. For example, the gate driver 304a receives a start pulse signal, a clock signal, or the like and outputs a pulse signal. The gate driver 304a has a function of controlling the potentials of wirings supplied with scan signals (hereinafter, such wirings are referred to as scan lines GL_1 to GL_X). Note that a plurality of gate drivers 304a may be provided to control the scan lines GL_1 to GL_X separately. Alternatively, the gate driver 304a has a function of supplying an initialization signal. Without being limited thereto, the gate driver 304a can supply another signal.

The source driver 304b includes a shift register or the like. The source driver 304b receives a signal (video signal) from which a data signal is derived, as well as a signal for driving the shift register, through the terminal portion 307. The source driver 304b has a function of generating a data signal to be written in the pixels 101 based on the video signal. In addition, the source driver 304b has a function of controlling output of a data signal in response to a pulse signal produced by input of a start pulse signal, a clock signal, or the like. Further, the source driver 304b has a function of controlling the potentials of wirings supplied with data signals (hereinafter such wirings are referred to as data lines DL_1 to DL_Y). Alternatively, the source driver 304b has a function of supplying an initialization signal. Without being limited thereto, the source driver 304b can supply another signal.

The source driver 304b includes a plurality of analog switches or the like, for example. The source driver 304b can output, as the data signals, signals obtained by time-dividing the video signal by sequentially turning on the plurality of analog switches.

A pulse signal and a data signal are input to each of the plurality of pixels 101 through one of the plurality of scan lines GL supplied with scan signals and one of the plurality of data lines DL supplied with data signals, respectively. Writing and holding of the data signal in each of the plurality of pixels 101 are performed by the gate driver 304a. For example, to the pixel 101 in the m-th row and the n-th column (m is a natural number of less than or equal to X, and n is a natural number of less than or equal to 1), a pulse signal is input from the gate driver 304a through the scan line GL_m, and a data signal is input from the source driver 304b through the data line DL_n in accordance with the potential of the scan line GL_m.

Figure 13A:
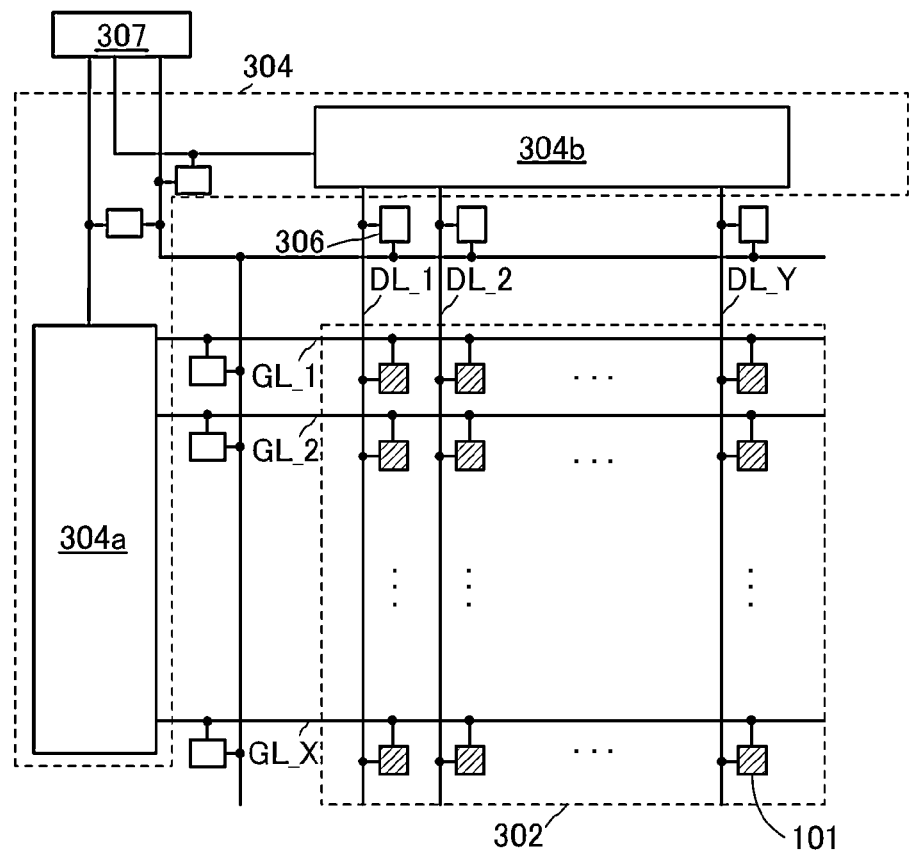
FIGS. 13A and 13B are circuit diagrams illustrating a display device.

The protection circuit 306 shown in FIG. 13A is electrically connected to, for example, the scan line GL between the gate driver 304a and the pixel 101. Alternatively, the protection circuit 306 is electrically connected to the data line DL between the source driver 304b and the pixel 101. Alternatively, the protection circuit 306 can be electrically connected to a wiring between the gate driver 304a and the terminal portion 307. Alternatively, the protection circuit 306 can be electrically connected to a wiring between the source driver 304b and the terminal portion 307. Note that the terminal portion 307 means a portion having terminals for inputting power, control signals, and video signals to the display device from external circuits.

The protection circuit 306 is a circuit that electrically connects a wiring connected to the protection circuit to another wiring when a potential out of a certain range is applied to the wiring connected to the protection circuit.

As illustrated in FIG. 13A, the protection circuits 306 are provided for the pixel portion 302 and the driver circuit portion 304, so that the resistance of the display device to overcurrent generated by electrostatic discharge (ESD) or the like can be improved. Note that the configuration of the protection circuits 306 is not limited to that, and for example, the protection circuit 306 may be configured to be electrically connected to the gate driver 304a or the protection circuit 306 may be configured to be electrically connected to the source driver 304b. Alternatively, the protection circuit 306 may be configured to be electrically connected to the terminal portion 307.

In FIG. 13A, an example in which the driver circuit portion 304 includes the gate driver 304a and the source driver 304b is shown; however, the structure is not limited thereto. For example, only the gate driver 304a may be formed and a separately prepared substrate where a source driver circuit is formed (e.g., a driver circuit substrate formed with a single crystal semiconductor film or a polycrystalline semiconductor film) may be mounted.

Figure 13B:
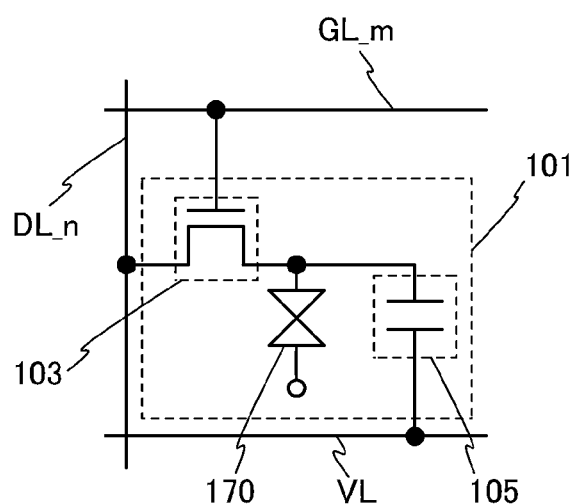

Each of the plurality of pixels 101 in FIG. 13A can have the structure shown in FIG. 13B, for example.

The pixel 101 illustrated in FIG. 13B includes the liquid crystal element 170, the transistor 103, and the capacitor 105. Note that the liquid crystal element 170, the transistor 103, and the capacitor 105 can be those in the display device in FIG. 1 described in Embodiment 1.

The potential of one of a pair of electrodes of the liquid crystal element 170 is set in accordance with the specifications of the pixel 101 as appropriate. The alignment state of the liquid crystal element 170 depends on written data. A common potential may be supplied to one of the pair of electrodes of the liquid crystal element 170 included in each of the plurality of pixels 101. Further, the potential supplied to one of a pair of electrodes of the liquid crystal element 170 in the pixel 101 in one row may be different from the potential supplied to one of a pair of electrodes of the liquid crystal element 170 in the pixel 101 in another row.

As examples of a driving method of the display device including the liquid crystal element 170, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and a variety of liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel 101 in the m-th row and the n-th column, one of a source and a drain of the transistor 103 is electrically connected to the data line DL_n, and the other is electrically connected to the other of a pair of electrodes of the liquid crystal element 170. A gate of the transistor 103 is electrically connected to the scan line GL_m. The transistor 103 has a function of controlling whether to write a data signal by being turned on or off.

One of a pair of electrodes of the capacitor 105 is electrically connected to a wiring to which a potential is supplied (hereinafter referred to as a potential supply line VL), and the other is electrically connected to the other of the pair of electrodes of the liquid crystal element 170. The potential of the potential supply line VL is set in accordance with the specifications of the pixel 101 as appropriate. The capacitor 105 functions as a storage capacitor for storing written data.

For example, in the display device including the pixel 101 in FIG. 13A, the pixels 101 are sequentially selected row by row by the gate driver 304a, whereby the transistors 103 are turned on and a data signal is written.

When the transistors 103 are turned off, the pixels 101 in which the data has been written are brought into a holding state. This operation is sequentially performed row by row; thus, an image is displayed.

The structure described in this embodiment can be used in appropriate combination with the structure described in any of the other embodiments.

Embodiment 4

In this embodiment, a display module and an electronic device that can be formed using a display device of one embodiment of the present invention are described with reference to FIG. 14 and FIGS. 15A to 15H.

Figure 14:
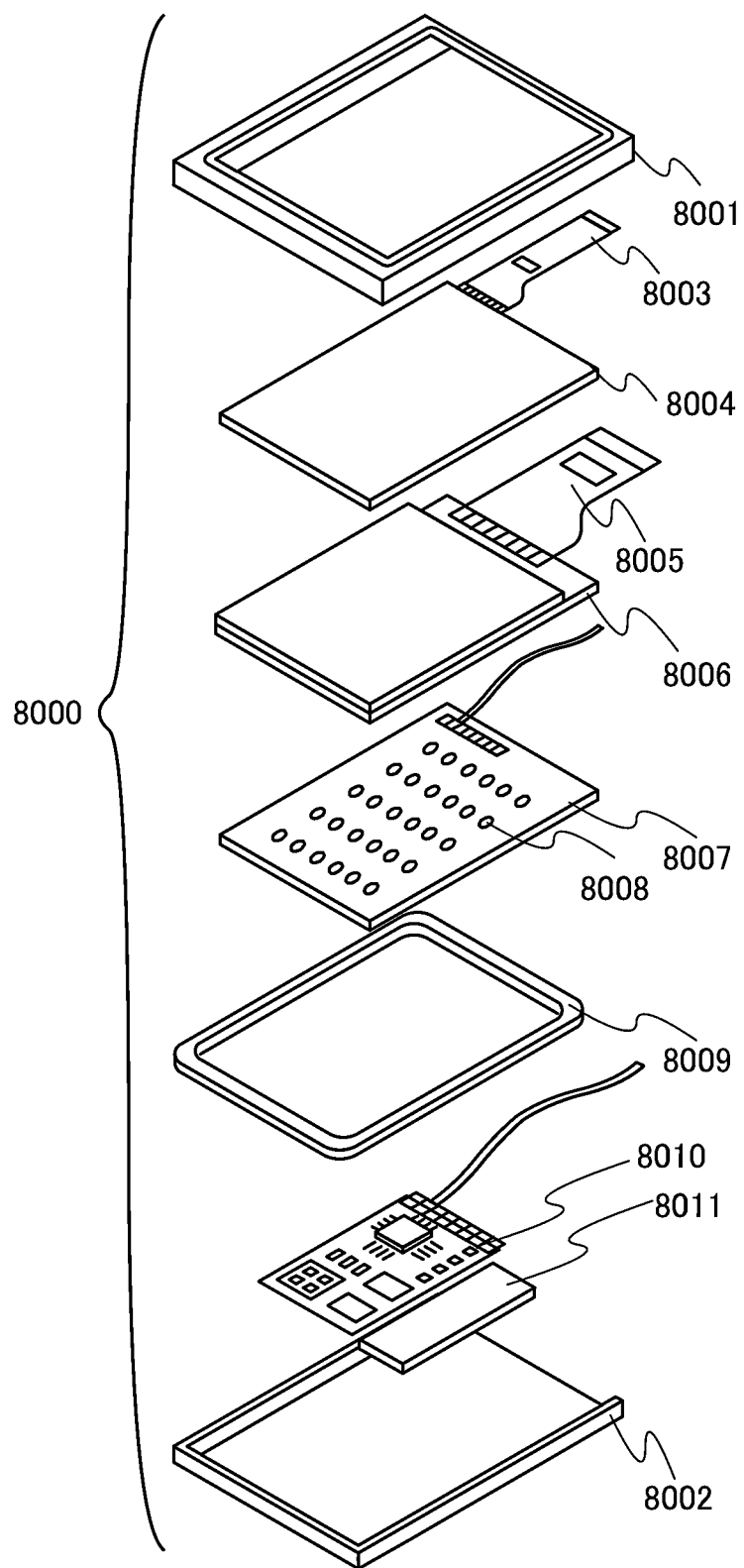
FIG. 14 illustrates a display module.

In a display module 8000 illustrated in FIG. 14, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002.

The display device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 15A to 15H illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 15A:
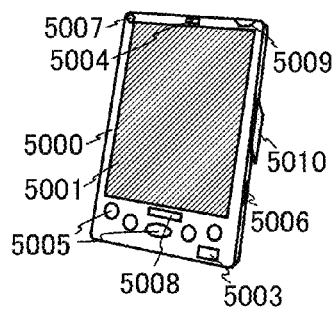
FIGS. 15A to 15H illustrate electronic devices.
Figure 15B:
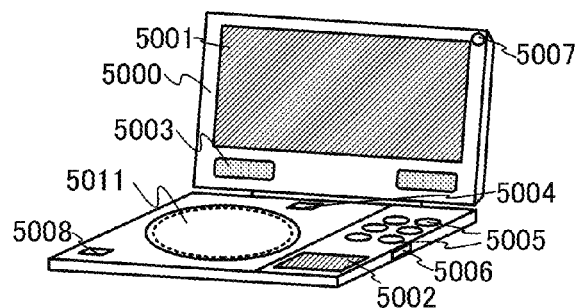
Figure 15C:
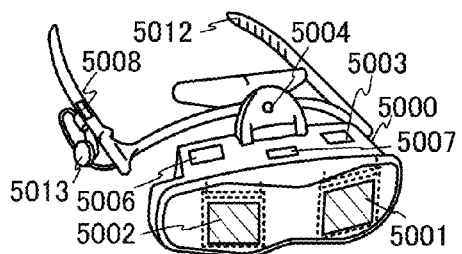
Figure 15D:
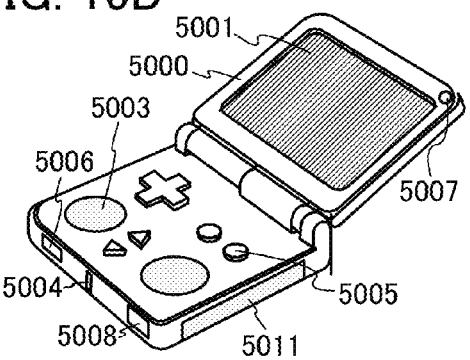
Figure 15E:
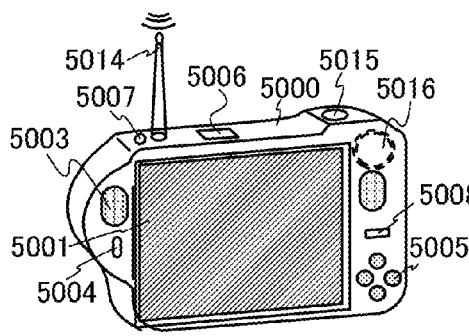
Figure 15F:
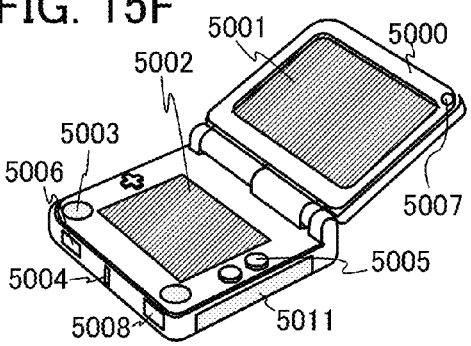
Figure 15G:
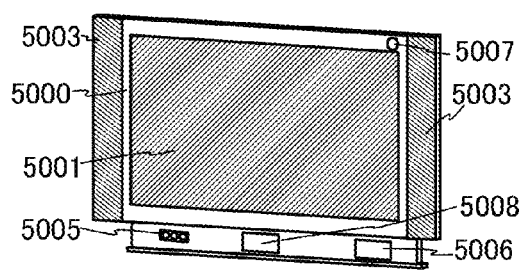
Figure 15H:
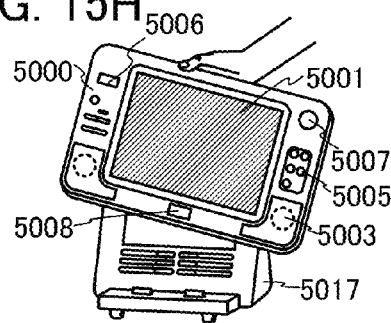

FIG. 15A illustrates a mobile computer that can include a switch 5009, an infrared port 5010, and the like in addition to the above components. FIG. 15B illustrates a portable image reproducing device (e.g., a DVD player) that is provided with a memory medium and can include a second display portion 5002, a memory medium reading portion 5011, and the like in addition to the above components. FIG. 15C illustrates a goggle-type display that can include the second display portion 5002, a support 5012, an earphone 5013, and the like in addition to the above components. FIG. 15D illustrates a portable game machine that can include the memory medium reading portion 5011 and the like in addition to the above components. FIG. 15E illustrates a digital camera that has a television reception function and can include an antenna 5014, a shutter button 5015, an image receiving portion 5016, and the like in addition to the above components. FIG. 15F illustrates a portable game machine that can include the second display portion 5002, the memory medium reading portion 5011, and the like in addition to the above components. FIG. 15G illustrates a television receiver that can include a tuner, an image processing portion, and the like in addition to the above components. FIG. 15H illustrates a portable television receiver that can include a charger 5017 capable of transmitting and receiving signals, and the like in addition to the above components.

The electronic devices illustrated in FIGS. 15A to 15H can have a variety of functions. For example, a function of displaying a variety of data (a still image, a moving image, a text image, and the like) on a display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on a display portion, and the like can be given. Further, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIGS. 15A to 15H are not limited to those described above, and the electronic devices can have a variety of functions.

The electronic devices described in this embodiment each include the display portion for displaying some sort of data.

The structure described in this embodiment can be used in appropriate combination with the structure described in any of the other embodiments.

This application is based on Japanese Patent Application serial no. 2013-087969 filed with Japan Patent Office on Apr. 19, 2013, the entire contents of which are hereby incorporated by reference.

What is claimed is:

1. A display device comprising:
   a pixel electrode;
   a transistor electrically connected to the pixel electrode, the transistor comprising:
   a light-transmitting semiconductor layer; and
   a data line and a conductive layer over and in contact with the light-transmitting semiconductor layer;
   a first insulating layer over and in contact with the light-transmitting semiconductor layer, a top surface of the data line, and a top surface of the conductive layer;
   a second insulating layer over and in contact with the first insulating layer;
   a scan line electrically connected to the transistor; and
   a capacitor electrically connected to the transistor, the capacitor comprising an electrode and the pixel electrode,
   wherein the second insulating layer is over and in contact with the electrode,
   wherein the transistor and the scan line overlap with each other,
   wherein the electrode and the light-transmitting semiconductor layer are on a same surface,
   wherein a conductivity of the electrode is higher than a conductivity of the light-transmitting semiconductor layer,
   wherein the electrode and the light-transmitting semiconductor layer comprise In, Zn, and M,
   wherein M is a material selected from Al, Ga, Ge, Y, Zr, Sn, La, Ce, and Hf,
   wherein the pixel electrode extends to intersect with the scan line, and
   wherein each of the data line and the scan line has a linear shape without a convex portion.

2. The display device according to claim 1,
   wherein the light-transmitting semiconductor layer comprises an oxide semiconductor.

3. The display device according to claim 1,
   wherein the scan line is positioned between a first part of the pixel electrode and a second part of the pixel electrode,
   wherein the electrode comprises a first layer and a second layer, the first layer and the first part of the pixel electrode overlap with each other, and the second layer and the second part of the pixel electrode overlap with each other,
   wherein the scan line is between the first layer and the second layer, and wherein the first layer is electrically connected to the second layer through a capacitor line, and the capacitor line extends in a direction substantially parallel to the data line.

4. An electronic device comprising the display device according to claim 1.

5. A display device comprising:
a first substrate;
a second substrate;
a liquid crystal between the first substrate and the second substrate;
a pixel electrode over the first substrate;
a transistor electrically connected to the pixel electrode, the transistor comprising:
  a light-transmitting semiconductor layer; and
  a data line and a conductive layer over and in contact with the light-transmitting semiconductor layer;
a first insulating layer over and in contact with the light-transmitting semiconductor layer, a top surface of the data line, and a top surface of the conductive layer;
a second insulating layer over and in contact with the first insulating layer;
a scan line electrically connected to the transistor; and
a capacitor electrically connected to the transistor, the capacitor comprising an electrode and the pixel electrode,
wherein the second insulating layer is over and in contact with the electrode,
wherein the transistor and the scan line overlap with each other,
wherein the electrode and the light-transmitting semiconductor layer are on a same surface,
wherein the electrode and the light-transmitting semiconductor layer comprise In, Zn, and M,
wherein M is a material selected from Al, Ga, Ge, Y, Zr, Sn, La, Ce, and Hf,
wherein the pixel electrode extends to intersect with the scan line, and
wherein each of the data line and the scan line has a linear shape without a convex portion.

6. The display device according to claim 5,
wherein the light-transmitting semiconductor layer comprises an oxide semiconductor.

7. The display device according to claim 5,
wherein the scan line is positioned between a first part of the pixel electrode and a second part of the pixel electrode,
wherein the electrode comprises a first layer and a second layer, the first layer and the first part of the pixel electrode overlap with each other, and the second layer and the second part of the pixel electrode overlap with each other,
wherein the scan line is between the first layer and the second layer, and
wherein the first layer is electrically connected to the second layer through a capacitor line, and the capacitor line extends in a direction substantially parallel to the data line.

8. An electronic device comprising the display device according to claim 5.

9. A display device comprising:
a first scan line;
a second scan line;
a data line;
a capacitor line;
a first pixel comprising:
  a first transistor electrically connected to the first scan line and the data line, the first transistor comprising:
    a first light-transmitting semiconductor layer; and
    the data line and a first conductive layer over and in contact with the first light-transmitting semiconductor layer;
  a first insulating layer over and in contact with the first light-transmitting semiconductor layer, a top surface of the data line, and a top surface of the first conductive layer;
  a second insulating layer over and in contact with the first insulating layer;
  a first pixel electrode electrically connected to the first transistor, wherein the first pixel electrode extends to intersect with the first scan line; and
  a first capacitor electrically connected to the capacitor line and the first transistor, the first capacitor comprising a first electrode and the first pixel electrode; and
a second pixel adjacent to the first pixel, the second pixel comprising:
  a second transistor electrically connected to the second scan line and the data line, the second transistor comprising:
    a second light-transmitting semiconductor layer; and
    the data line and a second conductive layer over and in contact with the second light-transmitting semiconductor layer;
  a third insulating layer over and in contact with the second light-transmitting semiconductor layer, a top surface of the data line, and a top surface of the second conductive layer;
  a fourth insulating layer over and in contact with the third insulating layer;
  a second pixel electrode electrically connected to the second transistor, wherein the second pixel electrode extends to intersect with the second scan line; and
  a second capacitor electrically connected to the capacitor line and the second transistor, the second capacitor comprising a second electrode and the second pixel electrode,
wherein the second insulating layer is over and in contact with the first electrode,
wherein the fourth insulating layer is over and in contact with the second electrode,
wherein the first electrode, the second electrode, the first light-transmitting semiconductor layer, and the second light-transmitting semiconductor layer are on a same surface,
wherein a material of the capacitor line and a material of the first and second electrodes are different from each other,
wherein the first electrode and the second electrode share a first layer, and
wherein each of the data line, the first scan line, and the second scan line has a linear shape without a convex portion.

10. The display device according to claim 9,
wherein the first light-transmitting semiconductor layer comprises an oxide semiconductor.

11. The display device according to claim 10,
wherein the first light-transmitting semiconductor layer comprises In, Zn, and M, and
wherein M is a material selected from Al, Ga, Ge, Y, Zr, Sn, La, Ce, and Hf.

12. The display device according to claim 9,
wherein the first scan line is positioned between a first part of the first pixel electrode and a second part of the first pixel electrode,
wherein the first electrode comprises the first layer and a second layer, the first layer and the first part of the first pixel electrode overlap with each other, and the second layer and the second part of the first pixel electrode overlap with each other,
wherein the first scan line is between the first layer and the second layer, and
wherein the first layer is electrically connected to the second layer through the capacitor line, and the capacitor line extends in a direction substantially parallel to the data line.

13. An electronic device comprising the display device according to claim 9.

14. The display device according to claim 1,
wherein the electrode further comprises hydrogen.

15. The display device according to claim 5,
wherein the first insulating layer comprises an inorganic insulating material and oxygen, and
wherein the second insulating layer comprises hydrogen.

16. The display device according to claim 15, wherein a conductivity of the electrode is higher than a conductivity of the light-transmitting semiconductor layer.

17. The display device according to claim 9,
wherein each of the first insulating layer and the third insulating layer comprises an inorganic insulating material and oxygen, and
wherein each of the second insulating layer and the fourth insulating layer comprises hydrogen.

18. The display device according to claim 17,
wherein a conductivity of the first electrode is higher than a conductivity of the first light-transmitting semiconductor layer, and
wherein a conductivity of the second electrode is higher than a conductivity of the second light-transmitting semiconductor layer.

19. The display device according to claim 1,
wherein a part of the first insulating layer is over and in contact with the electrode.

20. The display device according to claim 5,
wherein a part of the first insulating layer is over and in contact with the electrode.

21. The display device according to claim 9,
wherein a part of the first insulating layer is over and in contact with the first electrode, and
wherein a part of the third insulating layer is over and in contact with the third electrode.

22. The display device according to claim 1, further comprising a capacitor line over and in contact with the electrode.

23. The display device according to claim 5, further comprising a capacitor line over and in contact with the electrode.

24. The display device according to claim 9,
wherein the capacitor line is over and in contact with the first and second electrodes.

25. The display device according to claim 1, further comprising an alignment film over the pixel electrode and the second insulating layer.

26. The display device according to claim 5, further comprising an alignment film over the pixel electrode and the second insulating layer.

27. The display device according to claim 9, further comprising:
a first alignment film over the first pixel electrode and the second insulating layer; and
a second alignment film over the second pixel electrode and the fourth insulating layer.

* * * * *